(12) United States Patent
Baba et al.

(10) Patent No.: US 11,137,295 B2
(45) Date of Patent: Oct. 5, 2021

(54) SENSOR HAVING A FILM PORTION, AN ELECTRODE REGION AND A MAGNETIC PORTION

(71) Applicant: KABUSHIKI KAISHA TOSHIBA, Tokyo (JP)

(72) Inventors: Shotaro Baba, Kanagawa (JP); Yoshihiko Fuji, Kanagawa (JP); Kazuaki Okamoto, Kanagawa (JP); Shiori Kaji, Kanagawa (JP); Tomohiko Nagata, Kanagawa (JP); Yoshihiro Higashi, Ishikawa (JP); Akiko Yuzawa, Kanagawa (JP); Michiko Hara, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 349 days.

(21) Appl. No.: 16/276,656

(22) Filed: Feb. 15, 2019

(65) Prior Publication Data

US 2020/0041363 A1 Feb. 6, 2020

(30) Foreign Application Priority Data

Aug. 1, 2018 (JP) .............................. JP2018-144912

(51) Int. Cl.
*G01L 1/12* (2006.01)
*H01F 1/00* (2006.01)
(Continued)

(52) U.S. Cl.
CPC ............ *G01L 1/125* (2013.01); *H01F 1/0009* (2013.01); *H01L 41/125* (2013.01); *H04R 1/08* (2013.01)

(58) Field of Classification Search
None
See application file for complete search history.

(56) References Cited

U.S. PATENT DOCUMENTS 9,176,014 B2 * 11/2015 Fuji ....................... H04R 15/00
2015/0082901 A1 3/2015 Fuji et al.
(Continued)

FOREIGN PATENT DOCUMENTS

JP 2015-51070 A 3/2015
JP 2017-40509 A 2/2017
(Continued)

OTHER PUBLICATIONS

Janeiro et at. "Linearization and Field Detectivity in Magnetic Tunnel Junction Sensors Connected in Series Incorporating 16 nm-Thick NiFe Free Layers," IEEE Transactions on Magnetics (Nov. 2012), 48:4111-14.
(Continued)

*Primary Examiner* — Peter J Macchiarolo
*Assistant Examiner* — Jermaine L Jenkins
(74) *Attorney, Agent, or Firm* — Finnegan, Henderson, Farabow, Garrett & Dunner L.L.P.

(57) ABSTRACT

According to one embodiment, a sensor includes a supporter, a film portion, a first element, and a first magnetic portion. The supporter includes a first support portion and a second support portion. The film portion includes a first partial region supported by the first support portion. The first element is provided at the first partial region. The first element includes a first electrode region, a first opposing electrode region, and a first magnetic layer provided between the first electrode region and the first opposing electrode region. A direction from the second support portion toward the first magnetic portion is aligned with a first direction. The first direction is from the first opposing electrode region toward the first electrode region. At least a portion of the first magnetic portion overlaps at least a portion of the first element in a direction crossing the first direction.

19 Claims, 13 Drawing Sheets

(51) Int. Cl.
*H01L 41/12* (2006.01)
*H04R 1/08* (2006.01)

(56) References Cited

U.S. PATENT DOCUMENTS

2017/0074949 A1   3/2017   Higashi et al.
2017/0135592 A1   5/2017   Fuji et al.

FOREIGN PATENT DOCUMENTS

| JP | 2017-53723 A | 3/2017 |
| JP | 2017-53835 A | 3/2017 |
| JP | 2018-6769 A  | 1/2018 |

OTHER PUBLICATIONS

Yuan et al., "Double-pinned magnetic tunnel junction sensors with spin-valve-like sensing layers," Journal of Applied Physics (Aug. 4, 2015), 118:053904-1 to 053904-4.

* cited by examiner

SENSOR HAVING A FILM PORTION, AN ELECTRODE REGION AND A MAGNETIC PORTION

CROSS-REFERENCE TO RELATED APPLICATIONS

This application is based upon and claims the benefit of priority from Japanese Patent Application No. 2018-144912, filed on Aug. 1, 2018; the entire contents of which are incorporated herein by reference.

FIELD

Embodiments described herein relate generally to a sensor.

BACKGROUND

For example, there is a sensor using a magnetic layer. For example, strain is detected by the sensor.

DETAILED DESCRIPTION

Figure 1A:
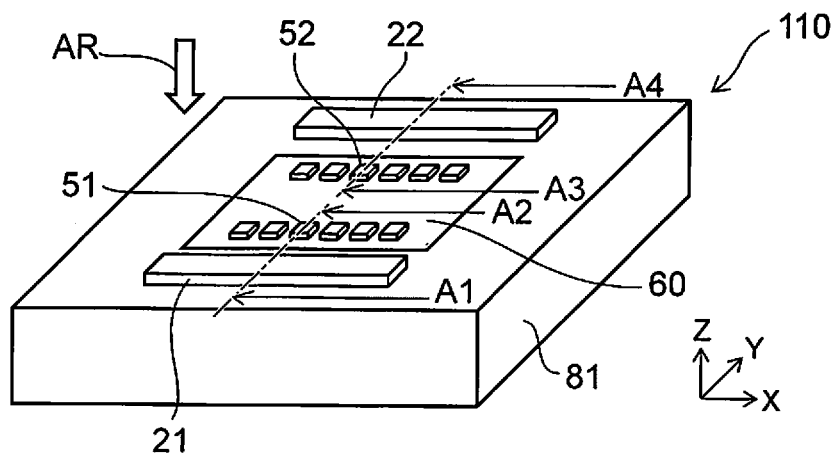
FIG. 1A to FIG. 1D are schematic views illustrating a sensor according to a first embodiment.

According to one embodiment, a sensor includes a supporter, a film portion, a first element, and a first magnetic portion. The supporter includes a first support portion and a second support portion. The film portion includes a first partial region supported by the first support portion. The first element is provided at the first partial region. The first element includes a first electrode region, a first opposing electrode region, and a first magnetic layer provided between the first electrode region and the first opposing electrode region. A direction from the second support portion toward the first magnetic portion is aligned with a first direction. The first direction is from the first opposing electrode region toward the first electrode region. At least a portion of the first magnetic portion overlaps at least a portion of the first element in a direction crossing the first direction.

According to another embodiment, a sensor includes a supporter, a film portion, a first element, and a first magnetic portion. The supporter includes a first support portion and a second support portion. The film portion includes a first partial region supported by the first support portion. The first element is provided at the first partial region. The first element includes a first electrode region, a first opposing electrode region, and a first magnetic layer provided between the first electrode region and the first opposing electrode region. A direction from the second support portion toward the first magnetic portion is aligned with a first direction. The first direction is from the first opposing electrode region toward the first electrode region. The first opposing electrode region is provided between the first partial region and the first electrode region in the first direction. The first electrode region has a first electrode surface and a second electrode surface. The second electrode surface is between the first electrode surface and the first magnetic layer in the first direction. The first magnetic portion has a first magnetic portion surface on the supporter side of the first magnetic portion. A position in the first direction of the first magnetic portion surface is between a position in the first direction of the first electrode surface and a position in the first direction of the supporter.

According to another embodiment, a sensor includes a supporter, a film portion, a first element, a first reference element, and a first magnetic portion. The supporter includes a first support portion, a second support portion, and a third support portion. The film portion includes a first partial region supported by the first support portion. The first element is provided at the first partial region. The first element includes a first electrode region, a first opposing electrode region, and a first magnetic layer provided between the first electrode region and the first opposing electrode region. A direction from the second support portion toward the first magnetic portion is aligned with a first direction. The first direction is from the first opposing electrode region toward the first electrode region. A direction from the third support portion toward the first reference element is aligned with the first direction. A position of the first magnetic portion in a first element direction is between a position of the first reference element in the first element direction and a position of the first element in the first element direction. The first element direction is from the first reference element toward the first element. The first reference element includes a first reference electrode region, a first reference opposing electrode region, and a first reference magnetic layer provided between the first reference electrode region and the first reference opposing electrode region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A to FIG. 1D are schematic views illustrating a sensor according to a first embodiment.

Figure 2A:
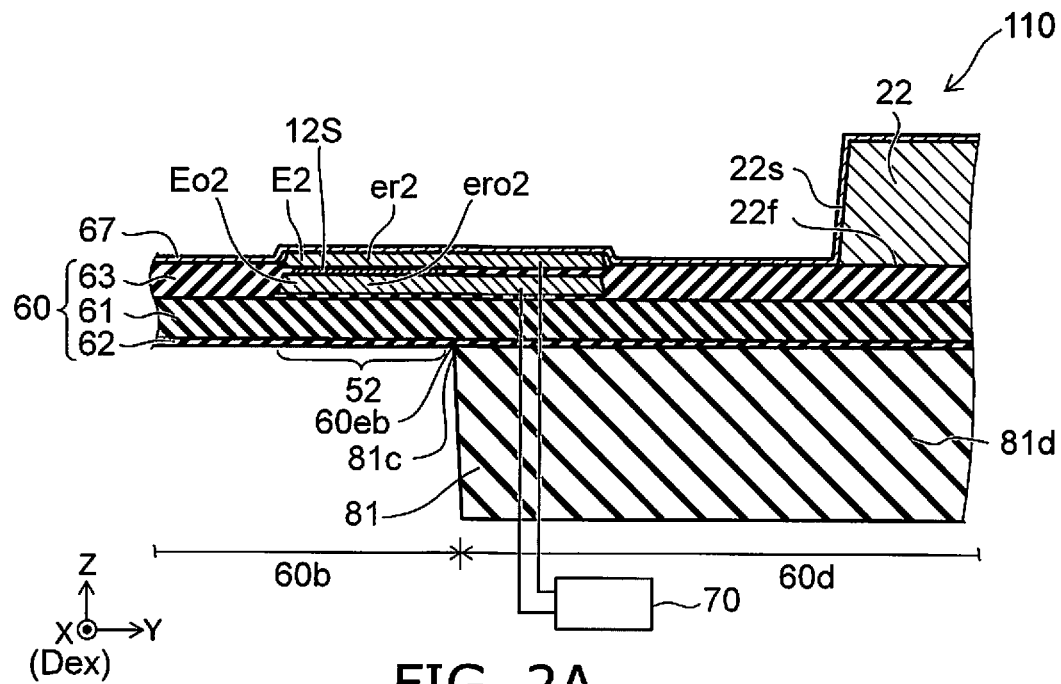
FIG. 2A and FIG. 2B are schematic views illustrating the sensor according to the first embodiment.
Figure 2B:
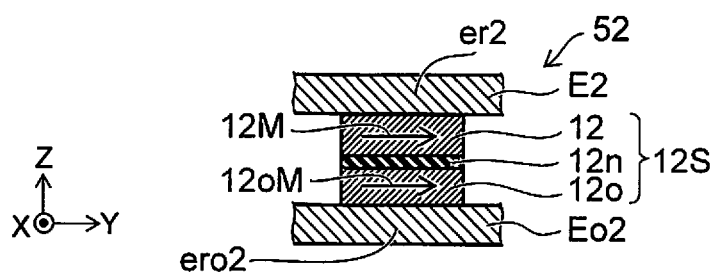

FIG. 2A and FIG. 2B are schematic views illustrating the sensor according to the first embodiment.

Figure 1B:
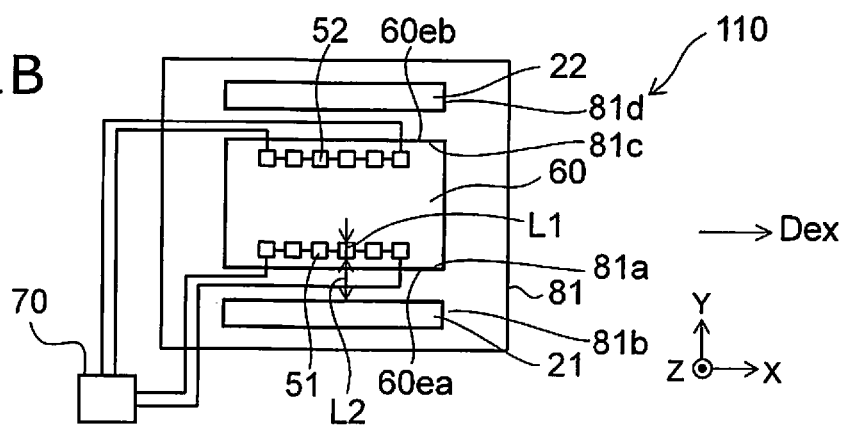
Figure 1C:
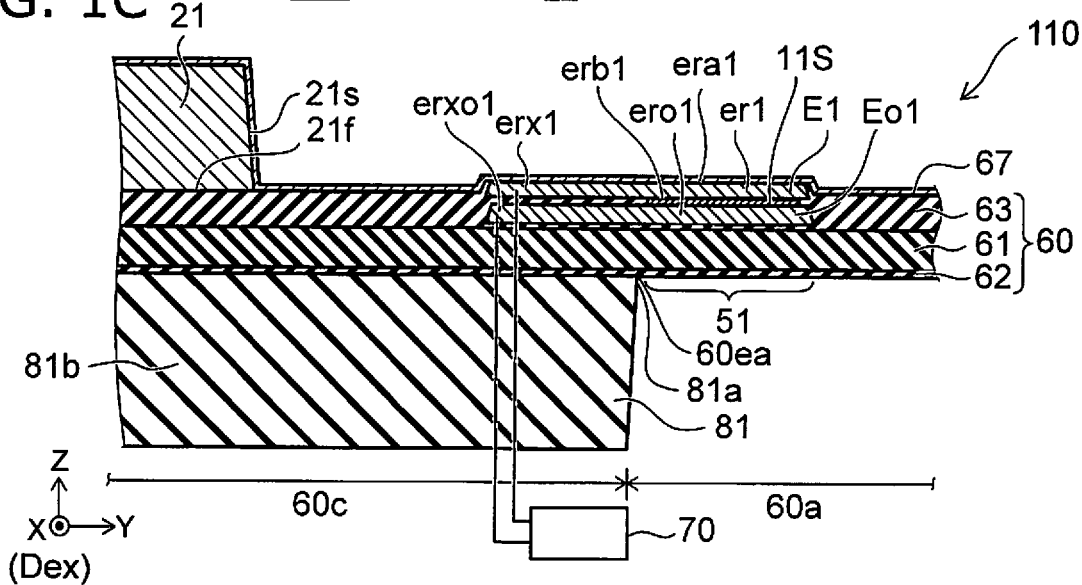
Figure 1D:
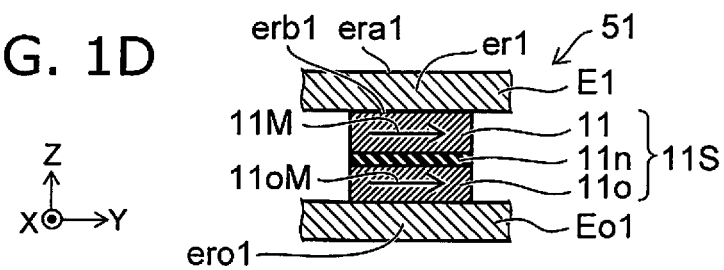

FIG. 1A is a perspective view. FIG. 1B is a plan view as viewed along arrow AR of FIG. 1A. FIG. 1C is a line A1-A2 cross-sectional view of FIG. 1A. FIG. 1D is a cross-sectional view of a portion of the sensor. FIG. 2A is a line A3-A4 cross-sectional view of FIG. 1A. FIG. 2B is a cross-sectional view of another portion of the sensor.

As shown in FIG. 1A and FIG. 1B, the sensor 110 according to the embodiment includes a supporter 81, a film portion 60, a first element 51, and a first magnetic portion 21. A second element 52 and a second magnetic portion 22 are further provided in the example.

As shown in FIG. 1C, the supporter 81 includes a first support portion 81a and a second support portion 81b.

The film portion 60 includes a first partial region 60a. The film portion 60 may include another partial region (e.g., a third partial region 60c). The film portion 60 is, for example, a diaphragm. The first partial region 60a is supported by the first support portion 81a. The first element 51 is provided at the first partial region 60a.

As shown in FIG. 1C, the first element 51 includes a first electrode region er1, a first opposing electrode region ero1, and a first stacked portion 11S. The first stacked portion 11S is provided between the first electrode region er1 and the first opposing electrode region ero1.

As shown in FIG. 1D, for example, the first stacked portion 11S includes a first magnetic layer 11, a first opposing magnetic layer 11o, and a first intermediate layer 11n. The first opposing magnetic layer 11o is provided between the first magnetic layer 11 and the first opposing electrode region ero1. The first intermediate layer 11n is provided between the first magnetic layer 11 and the first opposing magnetic layer 11o. The first intermediate layer 11n is nonmagnetic.

Thus, the first element 51 includes the first electrode region er1, the first opposing electrode region ero1, and the first magnetic layer 11.

As shown in FIG. 1C, the first electrode region er1 is a portion of a first electrode E1. The first electrode E1 may further include another electrode region erx1 in addition to the first electrode region er1. The first opposing electrode region ero1 is a portion of a first opposing electrode Eo1. The first opposing electrode Eo1 may further include another electrode region erxo1 in addition to the first opposing electrode region ero1.

Conductive layers that are electrically connected to the first element 51, etc., may be provided in regions other than the first partial region 60a. The conductive layers are, for example, interconnects. The conductive layers are, for example, the other electrode region erx1 and the other electrode region erxo1 recited above, etc.

As shown in FIG. 1C, the direction from the second support portion 81b toward the first magnetic portion 21 is aligned with a first direction from the first opposing electrode region ero1 toward the first electrode region er1.

The first direction is taken as a Z-axis direction. One direction perpendicular to the Z-axis direction is taken as an X-axis direction. A direction perpendicular to the Z-axis direction and the X-axis direction is taken as a Y-axis direction. The first direction corresponds to the stacking direction of the first opposing electrode region ero1 and the first electrode region er1. The direction from the second support portion 81b toward the first magnetic portion 21 may be taken as the first direction.

As shown in FIG. 1C, the thickness of the first partial region 60a is thinner than the thickness of the supporter 81 (e.g., the second support portion 81b). The thickness is the length along the Z-axis direction.

In the example as shown in FIG. 1C, the film portion 60 includes a first film 61, a second film 62, and a third film 63. The first film 61 is provided between the second film 62 and the first element 51. In the example, a portion of the third film 63 is provided between the first film 61 and the first element 51. In the example, a protective film 67 is provided on the film portion 60, the first element 51, and the first magnetic portion 21. The protective film 67 is provided also on a side surface 21s of the first magnetic portion 21. For example, the side surface 21s of the first magnetic portion 21 is aligned with the X-axis direction.

The first partial region 60a is formed of the first to third films 61 to 63. In the example, the film portion 60 further includes the third partial region 60c in addition to the first partial region 60a. The third partial region 60c also is formed of the first to third films 61 to 63.

For example, the third partial region 60c recited above is provided at the second support portion 81b of the supporter 81. The first magnetic portion 21 is provided at the third partial region 60c. For example, the third partial region 60c is provided between the second support portion 81b and the first magnetic portion 21. The second support portion 81b and the third partial region 60c substantially do not deform.

On the other hand, the first element 51 is provided at the first partial region 60a supported by the first support portion 81a. The first partial region 60a is deformable. For example, an external force (e.g., sound or the like) is applied to the first partial region 60a. The first partial region 60a deforms according to the applied external force. As described below, the electrical resistance of the first element 51 can change according to the deformation of the first partial region 60a. The external force can be detected by detecting the change of the electrical resistance.

Figure 10:
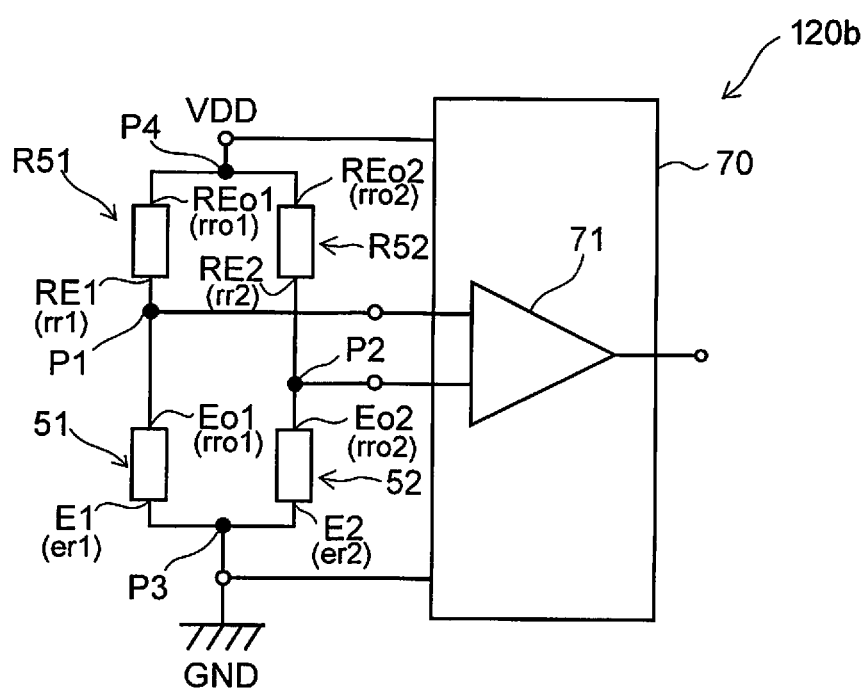
FIG. 10 is a schematic view illustrating a portion of a sensor according to the second embodiment.

As shown in FIG. 10, the first magnetic layer 11 has a first magnetization 11M. The first opposing magnetic layer 11o has a magnetization 11oM. The orientation of at least one of these magnetizations changes according to the deformation of the first partial region 60a. For example, the change is due to an inverse magnetostrictive effect. When the orientation of the at least one of these magnetizations changes, the electrical resistance changes according to the change of the orientation. For example, the change of the electrical resistance is due to a magnetoresistance effect.

A circuit portion 70 may be further provided as shown in FIG. 1C. For example, the circuit portion 70 is electrically connected to the other electrode region erx1 of the first electrode E1 and the other electrode region erxo1 of the first opposing electrode Eo1. The change of the electrical resistance recited above is detected by the circuit portion 70.

The first magnetic portion 21 is, for example, a magnet.

For example, a bias magnetic field that is emitted from the first magnetic portion 21 is applied to the first element 51.

The bias magnetic field has a Y-axis direction component. The magnetization of the magnetic layer included in the first element 51 can be controlled by the first magnetic portion 21. As described below, the magnetization of the magnetic layer included in the first element 51 can be caused to tilt with respect to the Y-axis direction. For example, by tilting the magnetization, the external force that is applied to the film portion can be detected with high sensitivity.

For example, as shown in FIG. 1B, the distance between the first magnetic portion 21 and the first element 51 is taken as a distance L2. The distance L2 is a length along a direction (e.g., the Y-axis direction) crossing the first direction. On the other hand, the size of the first element 51 is taken as a length L1. The length L1 is a length along the direction recited above (e.g., the Y-axis direction) crossing the first direction. In one example, the distance L2 is longer than the length L1. For example, the distance L2 is not less than 1.1 times and not more than 50 times the length L1. Thus, in the embodiment, the distance L2 between the first magnetic portion 21 and the first element 51 may be long.

As described above, the bias magnetic field from the first magnetic portion 21 is applied to the first element 51. At this time, for example, a magnetic field that has a nonuniform orientation is applied to the first element 51 if the distance L2 is excessively short. Therefore, there are cases where the control of the orientation of the magnetization of the first element 51 is nonuniform.

As recited above, a uniform bias magnetic field is easily applied to the first element 51 by setting the distance L2 to be longer than the length L1. Thereby, the orientation of the magnetization of the first element 51 is easily controlled uniformly.

For example, by setting the distance L2 to be longer than the length L1, for example, a space is obtained at the supporter 81. The exterior form of the sensor 110 can be reduced by providing interconnects (e.g., the other electrode region erx1 and the other electrode region erxo1 recited above, etc.) in the space (between the first magnetic portion 21 and the first element 51).

In the example, at least a portion of the first magnetic portion 21 overlaps at least a portion of the first element 51 in a direction crossing the first direction (the Z-axis direction). For example, at least a portion of the first magnetic portion 21 overlaps at least a portion of the first element 51 in a direction (e.g., the Y-axis direction) perpendicular to the first direction. In the example shown in FIG. 1C, a portion of the first magnetic portion 21 overlaps at least a portion of the first electrode region er1 in the Y-axis direction. An example of this configuration will now be described.

As shown in FIG. 1C, for example, the first opposing electrode region ero1 is provided between the first partial region 60*a* and the first electrode region er1 in the first direction (the Z-axis direction). In the first direction, for example, the first opposing electrode region ero1 is provided between the first film 61 and the first electrode region er1.

The first electrode region er1 has a first electrode surface era1 and a second electrode surface erb1. The second electrode surface erb1 is between the first electrode surface era1 and the first stacked portion 11S (the first magnetic layer 11) in the first direction (the Z-axis direction). As shown in FIG. 1D, the second electrode surface erb1 is between the first electrode surface era1 and the first magnetic layer 11 in the first direction. The first electrode surface era1 is, for example, the upper surface. The second electrode surface erb1 is, for example, the lower surface.

On the other hand, as shown in FIG. 1C, the first magnetic portion 21 has a first magnetic portion surface 21*f* on the supporter 81 side of the first magnetic portion 21. The first magnetic portion surface 21*f* is, for example, the surface on the second support portion 81*b* side. The first magnetic portion surface 21*f* is, for example, the lower surface of the first magnetic portion 21.

For example, the position in the first direction (the Z-axis direction) of the first magnetic portion surface 21*f* is between the position in the first direction of the first electrode surface era1 (e.g., the upper surface) and the position in the first direction of the supporter 81.

By such a configuration, the bias magnetic field that is emitted from the first magnetic portion 21 can be applied to the first element 51 stably. For example, the bias magnetic field from the first magnetic portion 21 has a Z-axis direction component. For example, by providing the first magnetic portion 21 at a position such that at least a portion of the first magnetic portion 21 overlaps at least a portion of the first element 51 in the Y-axis direction, a bias magnetic field that has a small Z-axis direction component can be applied to the first element 51.

For example, the position in the Z-axis direction of the first element 51 changes according to the deformation of the first partial region 60*a* of the film portion 60. In the case where the Z-axis direction component of the bias magnetic field applied to the first element 51 is large, the strength of the bias magnetic field applied to the first element 51 changes easily according to the change of the position in the Z-axis direction of the first element 51. Therefore, the degree of the control of the magnetization of the magnetic layer included in the first element 51 is nonuniform due to the change of the position in the Z-axis direction of the first element 51.

In the embodiment, for example, at least a portion of the first magnetic portion 21 overlaps at least a portion of the first element 51 in the Y-axis direction. Thereby, the Z-axis direction component of the bias magnetic field applied to the first magnetic layer 11 can be small. Thereby, the state of the magnetization of the magnetic layer included in the first element 51 can be easily controlled to be the desired state. For example, the external force that is applied to the film portion can be detected with high sensitivity. According to the embodiment, for example, a sensor can be provided in which the sensitivity can be increased.

As described above, in the example shown in FIG. 1C, the first opposing electrode region ero1 is provided between the film portion 60 (the first partial region 60*a*) and the first electrode region er1 in the first direction (the Z-axis direction). In such a case, for example, the first opposing magnetic layer 11*o* is provided between the first magnetic layer 11 and the film portion 60 (the first partial region 60*a*). In the embodiment, the first electrode region er1 may be provided between the first partial region 60*a* and the first opposing electrode region ero1 in the first direction (the Z-axis direction). In such a case, the first magnetic layer 11 may be provided between the first opposing magnetic layer 11*o* and the film portion 60 (the first partial region 60*a*).

As shown in FIG. 1B and FIG. 2A, the second element 52 and the second magnetic portion 22 are further provided in the example. The supporter 81 further includes a third support portion 81*c* and a fourth support portion 81*d*. The first support portion 81*a* is between the second support portion 81*b* and the fourth support portion 81*d*. The third support portion 81*c* is between the first support portion 81*a* and the fourth support portion 81*d*.

As shown in FIG. 2A, the film portion 60 further includes a second partial region 60*b*. The second partial region 60*b* is supported by the third support portion 81*c*. The film portion 60 may further include another partial region (e.g., a fourth partial region 60d). For example, the second partial region 60b is continuous with the first partial region 60a. For example, the first partial region 60a is the partial region on the first support portion 81a side. For example, the second partial region 60b is the partial region on the third support portion 81c side. For example, the film portion 60 has a center in the Y-axis direction. The region between the center and the first support portion 81a corresponds to the first partial region 60a. The region between the center and the third support portion 81c corresponds to the second partial region 60b.

The second element 52 is provided at the second partial region 60b. As shown in FIG. 2A, the second element 52 includes a second electrode region er2, a second opposing electrode region ero2, and a second stacked portion 12S. The second stacked portion 12S is provided between the second electrode region er2 and the second opposing electrode region ero2. As shown in FIG. 2B, the second stacked portion 12S includes a second magnetic layer 12. The second magnetic layer 12 is provided between the second electrode region er2 and the second opposing electrode region ero2.

As shown in FIG. 2B, the second stacked portion 12S includes a second magnetic layer 12, a second opposing magnetic layer 12o, and a second intermediate layer 12n. The second opposing magnetic layer 12o is provided between the second magnetic layer 12 and the second opposing electrode region ero2. The second intermediate layer 12n is provided between the second magnetic layer 12 and the second opposing magnetic layer 12o. The second intermediate layer 12n is nonmagnetic.

The second magnetic layer 12 has a magnetization 12M. The second opposing magnetic layer 12o has a magnetization 12oM. At least one of these magnetizations changes according to the deformation of the second partial region 60b. The electrical resistance of the second element 52 changes according to the deformation.

As shown in FIG. 2A, the direction from the fourth support portion 81d toward the second magnetic portion 22 is aligned with the first direction (the Z-axis direction). For example, the fourth partial region 60d of the film portion 60 is provided at the fourth support portion 81d of the supporter 81; and the second magnetic portion 22 is provided at the fourth partial region 60d. For example, the fourth partial region 60d is provided between the fourth support portion 81d and the second magnetic portion 22.

For example, at least a portion of the second magnetic portion 22 overlaps at least a portion of the second element 52 in a direction (e.g., the Y-axis direction) crossing the first direction (the Z-axis direction). In the example shown in FIG. 2A, a portion of the second magnetic portion 22 overlaps at least a portion of the second electrode region er2 in the Y-axis direction.

For example, the second magnetic portion 22 has a second magnetic portion surface 22f on the supporter 81 side of the second magnetic portion 22. The second magnetic portion surface 22f is, for example, the lower surface. The position in the first direction of the second magnetic portion surface 22f is between the position in the first direction of the upper surface of the second electrode region er2 and the position in the first direction of the supporter 81.

The protective film 67 is provided also on a side surface 22s of the second magnetic portion 22. For example, the side surface 22s of the second magnetic portion 22 is aligned with the X-axis direction. The second magnetic portion 22 is, for example, a magnet.

A bias magnetic field that is emitted from the second magnetic portion 22 can be applied to the second element 52 stably. Thereby, the state of the magnetization of the magnetic layer included in the second element 52 can be easily controlled to be the desired state. For example, in the second element 52 as well, the external force that is applied to the film portion can be detected with high sensitivity. According to the embodiment, for example, a sensor can be provided in which the sensitivity can be increased.

As shown in FIG. 2A, the second electrode region er2 is a portion of a second electrode E2. The second opposing electrode region ero2 is a portion of a second opposing electrode Eo2. The second electrode E2 and the second opposing electrode Eo2 are electrically connected to the circuit portion 70. The circuit portion 70 can detect the electrical resistance of the second element 52.

As shown in FIG. 1B, the distance between the first element 51 and the first magnetic portion 21 is shorter than the distance between the second element 52 and the first magnetic portion 21. The distance between the second element 52 and the second magnetic portion 22 is shorter than the distance between the first element 51 and the second magnetic portion 22.

For example, the first element 51 is provided between the first magnetic portion 21 and the second magnetic portion 22 in the Y-axis direction. For example, at least a portion of the second element 52 is provided between the first element 51 and the second magnetic portion 22.

As shown in FIG. 1B and FIG. 1C, the first partial region 60a includes a first end portion 60ea supported by the first support portion 81a.

As shown in FIG. 1B and FIG. 2A, the second partial region 60b includes a second end portion 60eb supported by the third support portion 81c.

As shown in FIG. 1B, the first end portion 60ea and the second end portion 60eb extend along an end portion extension direction Dex. The end portion extension direction Dex crosses the first direction (the Z-axis direction). In the example, the end portion extension direction Dex is the X-axis direction.

The length along the end portion extension direction Dex of the first end portion 60ea and the length along the end portion extension direction Dex of the second end portion 60eb each are longer than the distance between the first end portion 60ea and the second end portion 60eb. The film portion 60 is, for example, substantially rectangular. For example, the length along the end portion extension direction Dex (the length of the major axis) of the film portion 60 is longer than the length in a direction crossing the end portion extension direction Dex (the length of the minor axis) of the film portion 60.

The distance between the first element 51 and the first end portion 60ea is shorter than the distance between the second element 52 and the first end portion 60ea. The distance between the second element 52 and the second end portion 60eb is shorter than the distance between the first element 51 and the second end portion 60eb.

Multiple first elements 51 are provided in the example. The multiple first elements 51 are arranged along the end portion extension direction Dex (in the example, the X-axis direction). At least a portion of the multiple first elements 51 may be electrically connected in series to each other. Noise can be suppressed.

Multiple second elements 52 are provided in the example. The multiple second elements 52 are arranged along the end portion extension direction Dex (in the example, the X-axis direction). At least a portion of the multiple second elements 52 may be electrically connected in series to each other. The noise can be suppressed.

In the example shown in FIG. 2A, the second opposing electrode region ero2 is provided between the film portion 60 (the second partial region 60b) and the second electrode region er2 in the first direction (the Z-axis direction). In such a case, for example, the second opposing magnetic layer 12o is provided between the second magnetic layer 12 and the film portion 60 (the second partial region 60b). In the embodiment, the second electrode region er2 may be provided between the second partial region 60b and the second opposing electrode region ero2 in the first direction (the Z-axis direction). In such a case, the second magnetic layer 12 may be provided between the second opposing magnetic layer 12o and the film portion 60 (the second partial region 60b).

An example of a characteristic of the sensor 110 will now be described.

Figure 3:
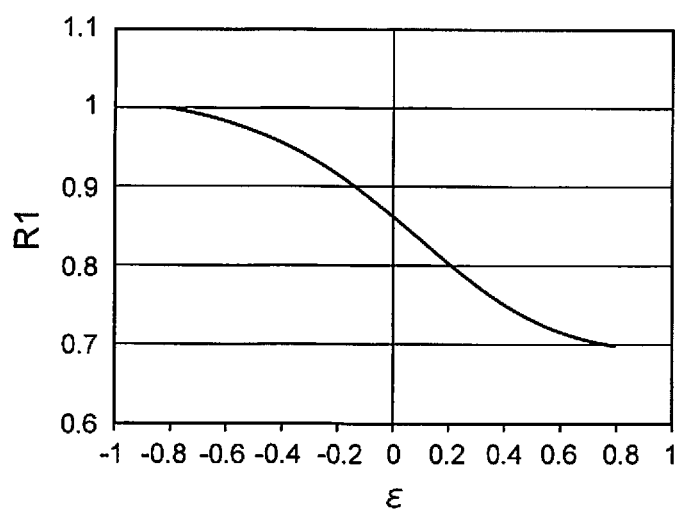
FIG. 3 is a graph illustrating a characteristic of the sensor according to the first embodiment.

FIG. 3 is a graph illustrating a characteristic of the sensor according to the first embodiment.

FIG. 3 illustrates a characteristic of the first element 51. For example, the characteristic of the second element 52 is similar to that of the first element 51. The horizontal axis of FIG. 3 is a strain ε (arbitrary units) of the film portion 60. The strain c corresponds to an external force (e.g., sound, etc.) received by the sensor 110. For example, the strain ε increases when the sound increases. The vertical axis is an electrical resistance R1 (arbitrary units) of the first element 51.

As shown in FIG. 3, the electrical resistance R1 changes when the strain ε changes. For example, when the external force (e.g., the sound or the like) is applied to the film portion 60, stress that is aligned with the Y-axis direction (referring to FIG. 1B) is applied to the first partial region 60a of the film portion 60. The strain ε is generated by the stress. For example, the orientation of the magnetization of the magnetic layer (e.g., the first magnetic layer 11) included in the first element 51 changes due to the strain ε.

In the embodiment, for example, the bias magnetic field from the first magnetic portion 21 is applied to the first magnetic layer 11; and in the initial state (the state of no strain ε), the magnetization 11M is tilted from the Y-axis direction. Thereby, the magnetization 11M can be changed by any strain ε. A small strain ε can be detected with high sensitivity.

Examples of the first element 51 and the second element 52 will now be described.

FIG. 4A to FIG. 4D are schematic views illustrating portions of the sensor according to the first embodiment.

Figure 4A:
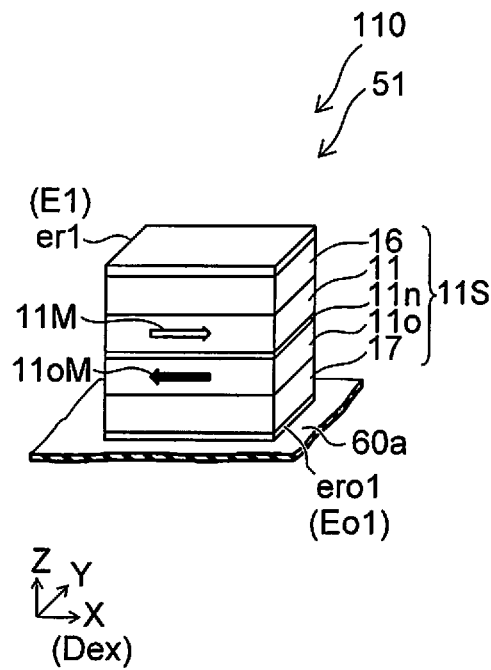
FIG. 4A to FIG. 4D are schematic views illustrating portions of the sensor according to the first embodiment.
Figure 4B:
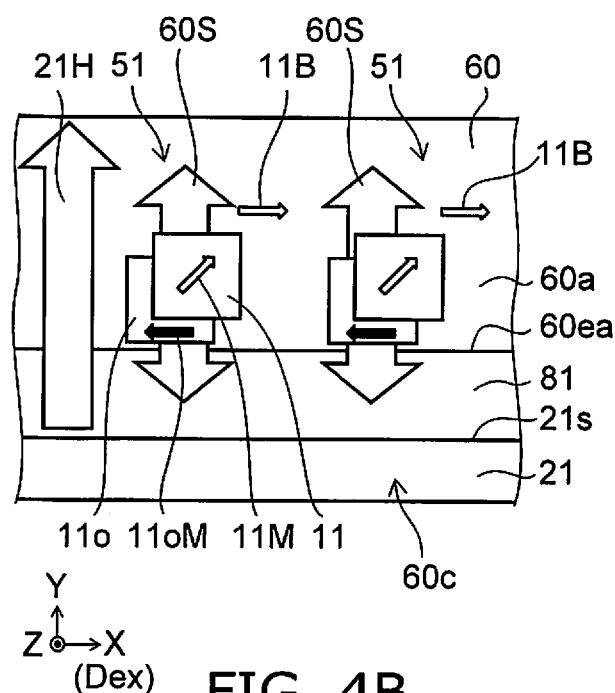
Figure 4C:
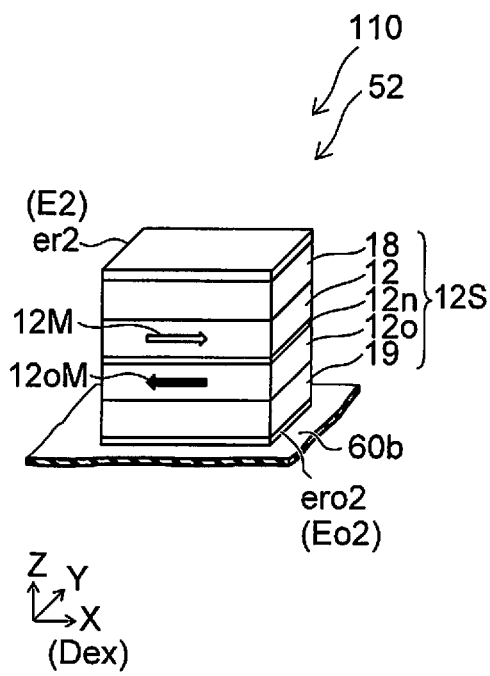
Figure 4D:
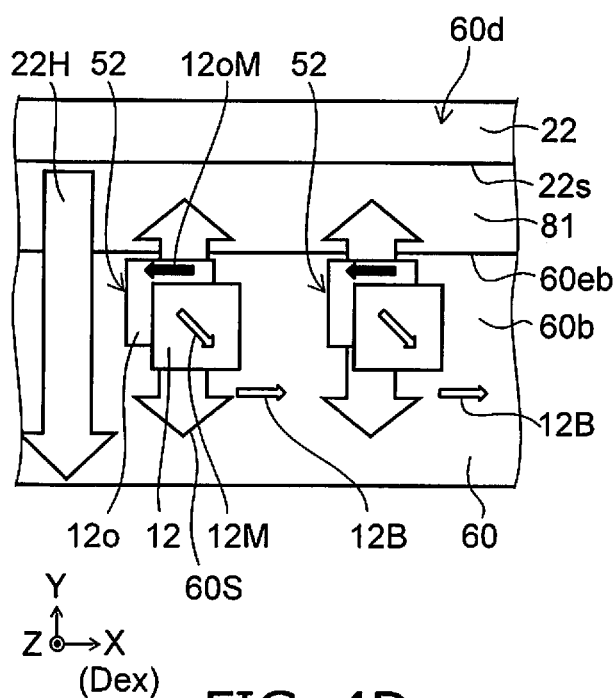

FIG. 4A is a perspective view illustrating the first element 51 and a portion of the film portion 60. FIG. 4B is a schematic plan view illustrating the first element 51, the portion of the film portion 60, and a portion of the first magnetic portion 21. FIG. 4C is a perspective view illustrating the second element 52 and a portion of the film portion 60. FIG. 4D is a schematic plan view illustrating the second element 52, the portion of the film portion 60, and a portion of the second magnetic portion 22.

As shown in FIG. 4A, the first opposing electrode Eo1 is provided between the first partial region 60a of the film portion 60 and the first stacked portion 11S. In the example, the first stacked portion 11S further includes a first antiferromagnetic layer 16 and a first opposing antiferromagnetic layer 17 in addition to the first magnetic layer 11, the first opposing magnetic layer 11o, and the first intermediate layer 11n.

The first antiferromagnetic layer 16 is provided between the first magnetic layer 11 and the first electrode region er1 (the first electrode E1). The first opposing antiferromagnetic layer 17 is provided between the first opposing magnetic layer 11o and the first opposing electrode region ero1 (the first opposing electrode Eo1).

In FIG. 4B, as the first element 51, the first magnetic layer 11 and the first opposing magnetic layer 11o are drawn with the positions of the first magnetic layer 11 and the first opposing magnetic layer 11o shifted for easier viewing of the drawing. In the example, the magnetization 11oM of the first opposing magnetic layer 11o changes less easily than the magnetization 11M of the first magnetic layer 11. For example, the effect from the first opposing antiferromagnetic layer 17 on the first opposing magnetic layer 11o is larger than the effect from the first antiferromagnetic layer 16 on the first magnetic layer 11.

As shown in FIG. 4B, a bias magnetic field 21H is emitted from the first magnetic portion 21. For example, the bias magnetic field 21H is aligned with a direction perpendicular to the side surface 21s of the first magnetic portion 21. The bias magnetic field 21H is applied to the first element 51.

An exchange coupling bias from the first opposing antiferromagnetic layer 17 is applied to the first opposing magnetic layer 11o. For example, the magnetization 11oM of the first opposing magnetic layer 11o is aligned with the X-axis direction. The orientation of the magnetization 11oM is fixed as-is by the effect from the first opposing antiferromagnetic layer 17. Therefore, the first opposing magnetic layer 11o is substantially not affected by the bias magnetic field 21H. The orientation of the magnetization 11oM is aligned with the X-axis direction.

On the other hand, an exchange coupling bias 11B from the first antiferromagnetic layer 16 is applied to the first magnetic layer 11. For example, the exchange coupling bias 11B is aligned with the X-axis direction. The orientation of the magnetization 11M of the first magnetic layer 11 changes easily compared to the magnetization 11oM. The exchange coupling bias 11B and the bias magnetic field 21H are applied to the first magnetic layer 11. The orientation of the magnetization 11M is aligned with a combined direction due to the combined magnetic bias of the bias magnetic field 21H and the effect (the exchange coupling bias) from the first antiferromagnetic layer 16. The magnetization 11M of the first magnetic layer 11 is tilted with respect to the end portion extension direction Dex (referring to FIG. 4B).

Thus, in the initial state, the magnetization 11M of the first magnetic layer 11 is tilted with respect to the end portion extension direction Dex. At this time, the first partial region 60a deforms when the force is applied to the film portion 60. The deformation includes a displacement along the Z-axis direction. Thereby, a strain 60S is generated in the film portion 60. The strain 60S has a component (a Y-axis direction component) perpendicular to the end portion extension direction Dex (e.g., the X-axis direction).

Stress that corresponds to such a strain 60S is applied to the first element 51. A strain that has a Y-axis direction component is generated in the first element 51. The magnetization 11M of the first magnetic layer 11 is tilted with respect to the direction (the Y-axis direction) of the strain in the initial state; therefore, even in the case of a small strain, the orientation of the magnetization 11M can be changed easily. Thereby, a sensor can be provided in which the sensitivity can be increased.

As shown in FIG. 4C, the second opposing electrode Eo2 is provided between the second partial region 60b of the film portion 60 and the second stacked portion 12S. The second stacked portion 12S further includes a second antiferromagnetic layer 18 and a second opposing antiferromagnetic layer 19 in addition to the second magnetic layer 12, the second opposing magnetic layer 12o, and the second intermediate layer 12n.

The second antiferromagnetic layer 18 is provided between the second magnetic layer 12 and the second electrode region erg (the second electrode E2). The second opposing antiferromagnetic layer 19 is provided between the second opposing magnetic layer 12o and the second opposing electrode region ero2 (the second opposing electrode Eo2).

In FIG. 4D, as the second element 52, the second magnetic layer 12 and the second opposing magnetic layer 12o are drawn with the positions of the second magnetic layer 12 and the second opposing magnetic layer 12o shifted for easier viewing of the drawing. In the example, the magnetization 12oM of the second opposing magnetic layer 12o changes less easily than the magnetization 12M of the second magnetic layer 12. For example, the effect from the second opposing antiferromagnetic layer 19 on the second opposing magnetic layer 12o is larger than the effect from the second antiferromagnetic layer 18 on the second magnetic layer 12.

As shown in FIG. 4D, a bias magnetic field 22H is emitted from the second magnetic portion 22. For example, the bias magnetic field 22H is aligned with a direction perpendicular to the side surface 22s of the second magnetic portion 22. The bias magnetic field 22H is applied to the second element 52.

An exchange coupling bias from the second opposing antiferromagnetic layer 19 is applied to the second opposing magnetic layer 12o. For example, the magnetization 12oM of the second opposing magnetic layer 12o is aligned with the X-axis direction. The orientation of the magnetization 12oM is fixed as-is by the effect from the second opposing antiferromagnetic layer 19. Therefore, the second opposing magnetic layer 12o is substantially not affected by the bias magnetic field 22H. The orientation of the magnetization 12oM is aligned with the X-axis direction.

On the other hand, an exchange coupling bias 12B from the second antiferromagnetic layer 18 is applied to the second magnetic layer 12. For example, the exchange coupling bias 12B is aligned with the X-axis direction. The orientation of the magnetization 12M of the second magnetic layer 12 changes easily compared to the magnetization 12oM. The exchange coupling bias and the bias magnetic field 22H are applied to the second magnetic layer 12. The orientation of the magnetization 12M is aligned with a combined direction due to the combined magnetic bias of the bias magnetic field 22H and the effect (the exchange coupling bias) from the second antiferromagnetic layer 18. The magnetization 12M of the second magnetic layer 12 is tilted with respect to the end portion extension direction Dex (referring to FIG. 4D).

Thus, in the initial state, the magnetization 12M of the second magnetic layer 12 is tilted with respect to the end portion extension direction Dex. At this time, a force is applied to the film portion 60; and the strain 60S is generated. The strain 60S has a component (a Y-axis direction component) perpendicular to the end portion extension direction Dex (e.g., the X-axis direction). The magnetization 12M of the second magnetic layer 12 is tilted with respect to the direction (the Y-axis direction) of the strain 60S in the initial state; therefore, even in the case of a small strain, the orientation of the magnetization 12M can be changed easily. Thereby, a sensor can be provided in which the sensitivity can be increased.

Heat treatment in a magnetic field may be performed in the manufacturing process of the first element 51. In this process, for example, the magnetization 11oM of the first opposing magnetic layer 11o is aligned with the X-axis direction. The exchange coupling bias 11B that is generated in the first magnetic layer 11 is aligned with the X-axis direction. Further, in this state, the bias magnetic field 21H from the first magnetic portion 21 is applied to the first element 51. The magnetization 11oM of the first opposing magnetic layer 11o is maintained to be aligned with the X-axis direction. The magnetization 11M of the first magnetic layer 11 is tilted with respect to the X-axis direction due to the exchange coupling bias 11B and the bias magnetic field 21H. For the second element 52 as well, the magnetization 12M of the second magnetic layer 12 also is tilted with respect to the X-axis direction. The magnetizations can be controlled in the desired directions by a simple manufacturing method.

FIG. 5A to FIG. 5D are schematic cross-sectional views illustrating portions of the sensor according to the first embodiment.

Figure 5A:
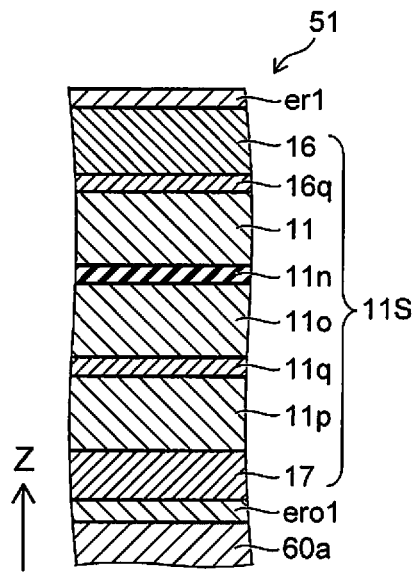
FIG. 5A to FIG. 5D are schematic cross-sectional views illustrating portions of the sensor according to the first embodiment.
Figure 5B:
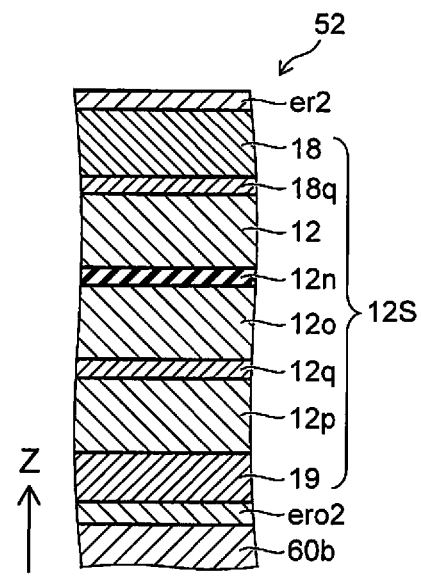
Figure 5C:
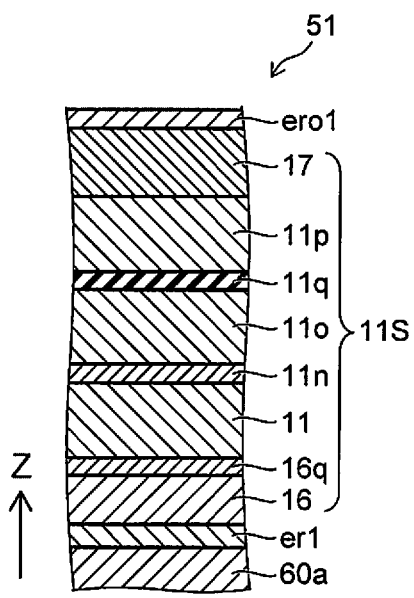
Figure 5D:
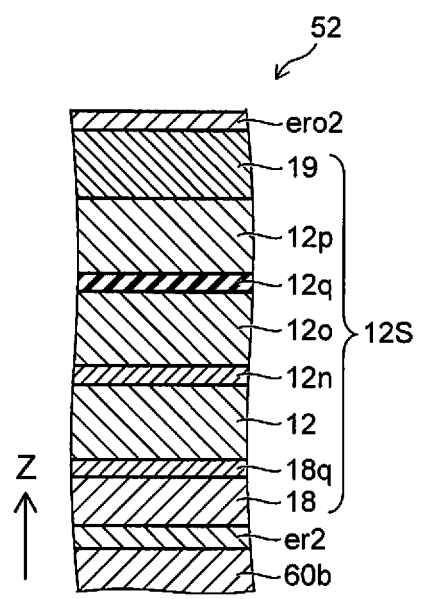

FIG. 5A and FIG. 5C illustrate the first element 51. FIG. 5B and FIG. 5D illustrate the second element 52.

In one example as shown in FIG. 5A, the first element 51 has the configuration of the first electrode region er1/first antiferromagnetic layer 16/layer 16q/first magnetic layer 11/first intermediate layer 11n/first opposing magnetic layer 11o/antiferromagnetic layer 11q/magnetic layer 11p/first opposing antiferromagnetic layer 17/first opposing electrode region ero1. The first element 51 is provided at the first partial region 60a of the film portion 60.

For example, the first opposing magnetic layer 11o and the magnetic layer 11p have antiferromagnetic exchange coupling. The exchange coupling bias 11B is generated in the first magnetic layer 11 by the first antiferromagnetic layer 16. The layer 16q may include, for example, two or more films. The layer 16q may be omitted. For example, the layer 16q adjusts the magnitude of the exchange coupling bias 11B.

In one example as shown in FIG. 5B, the second element 52 has the configuration of the second electrode region erg/second antiferromagnetic layer 18/layer 18q/second magnetic layer 12/second intermediate layer 12n/second opposing magnetic layer 12o/antiferromagnetic layer 12q/magnetic layer 12p/second opposing antiferromagnetic layer 19/second opposing electrode region ero2. The second element 52 is provided at the second partial region 60b of the film portion 60.

For example, the second opposing magnetic layer 12o and the magnetic layer 12p have antiferromagnetic exchange coupling. The exchange coupling bias 12B is generated in the second magnetic layer 12 by the second antiferromagnetic layer 18. The layer 18q may include, for example, two or more films. The layer 18q may be omitted. For example, the layer 18q adjusts the magnitude of the exchange coupling bias 12B.

In one example as shown in FIG. 5C, the first element 51 has the configuration of the first opposing electrode region ero1/first opposing antiferromagnetic layer 17/magnetic layer 11p/antiferromagnetic layer 11q/first opposing magnetic layer 11o/first intermediate layer 11n/first magnetic layer 11/layer 16q/first antiferromagnetic layer 16/first electrode region er1. The first element 51 is provided at the first partial region 60a of the film portion 60.

In the example as well, for example, the first opposing magnetic layer 11o and the magnetic layer 11p have antiferromagnetic exchange coupling. The exchange coupling bias 11B is generated in the first magnetic layer 11 by the first antiferromagnetic layer 16. The layer 16q may include, for example, two or more films. The layer 16q may be omitted. For example, the layer 16q adjusts the magnitude of the exchange coupling bias 11B.

In one example as shown in FIG. 5D, the second element 52 has the configuration of the second opposing electrode region ero2/second opposing antiferromagnetic layer 19/magnetic layer 12p/antiferromagnetic layer 12q/second opposing magnetic layer 12o/second intermediate layer 12n/second magnetic layer 12/layer 18q/second antiferromagnetic layer 18/second electrode region er2. The second element 52 is provided at the second partial region 60b of the film portion 60.

In the example as well, for example, the second opposing magnetic layer 12o and the magnetic layer 12p have antiferromagnetic exchange coupling. The exchange coupling bias 12B is generated in the second magnetic layer 12 by the second antiferromagnetic layer 18. The layer 18q may include, for example, two or more films. The layer 18q may be omitted. For example, the layer 18q adjusts the magnitude of the exchange coupling bias 12B.

For example, at least one of the layer 16q or the layer 18q includes a nonmagnetic layer. The nonmagnetic layer includes, for example, at least one selected from the group consisting of titanium (Ti), vanadium (V), chrome (Cr), manganese (Mn), copper (Cu), molybdenum (Mo), ruthenium (Ru), palladium (Pd), silver (Ag), and gold (Au). For example, at least one of the layer 16q or the layer 18q may include a magnetic layer (a ferromagnetic layer). The magnetic layer includes at least one selected from the group consisting of iron (Fe), cobalt (Co), and nickel (Ni). The ferromagnetic layer may include an alloy including at least one selected from the group recited above.

Figure 6A:
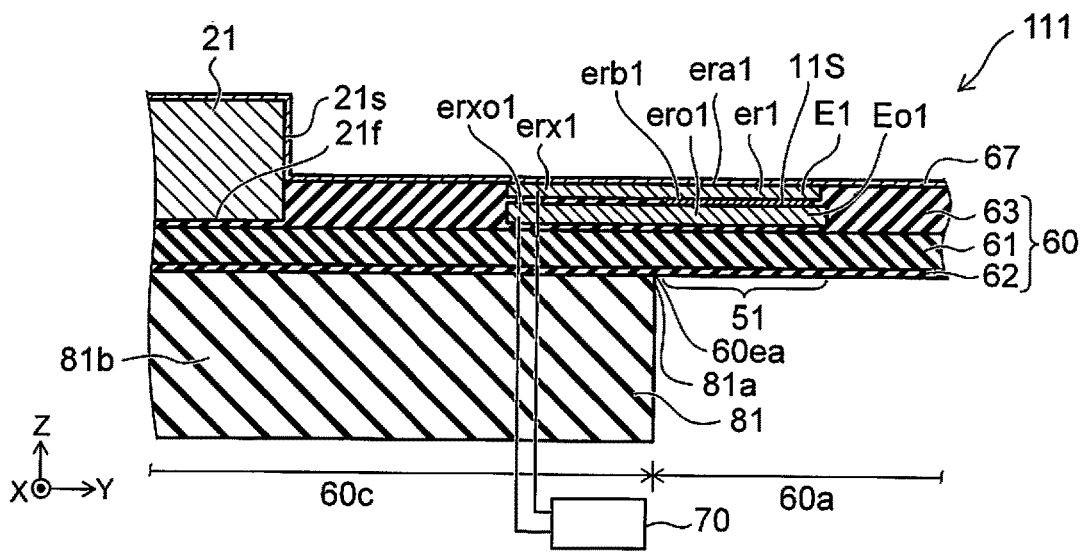
FIG. 6A to FIG. 6C are schematic cross-sectional views illustrating sensors according to the first embodiment.
Figure 6B:
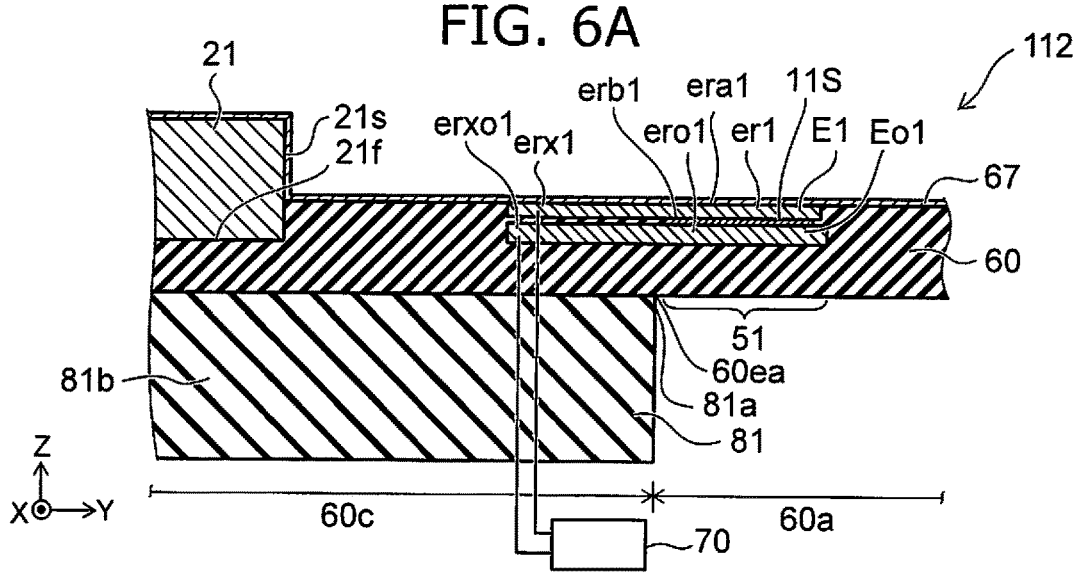
Figure 6C:
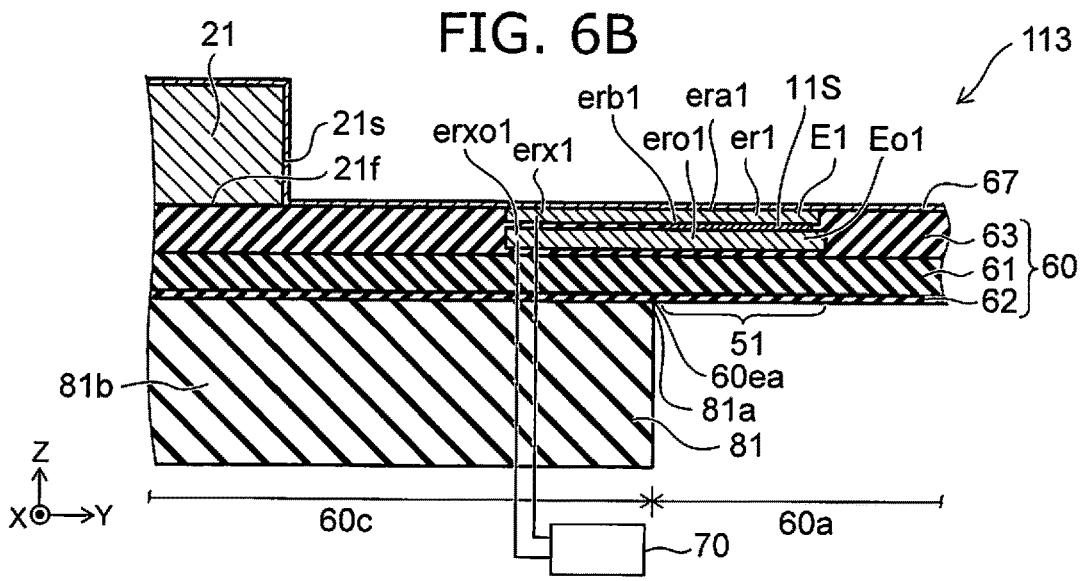

FIG. 6A to FIG. 6C are schematic cross-sectional views illustrating sensors according to the first embodiment.

In a sensor 111 as shown in FIG. 6A, in the Y-axis direction, the first magnetic portion 21 overlaps the first stacked portion 11S and the first electrode region er1 included in the first element 51. In the Y-axis direction, the first magnetic portion 21 further overlaps at least a portion of the first opposing electrode region ero1.

As in the sensor 110 and the sensor 111, the film portion 60 may include the first to third films 61 to 63. The material of the second film 62 is different from the material of the first film 61. The material of the third film 63 is different from the material of the first film 61. At least one of the second film 62 or the third film 63 may function as an etching stopper. The first film 61 may include, for example, at least one from the group consisting of silicon nitride, polysilicon, and silicon oxynitride. At least one of the second film 62 or the third film 63 may include, for example, at least one selected from the group consisting of silicon oxide and aluminum oxide. At least one of the second film 62 or the third film 63 may include an amorphous portion. For example, the material of the supporter 81 is different from the material of the second film 62. The supporter 81 includes, for example, at least one selected from the group consisting of silicon and silicon oxide.

As in a sensor 112 shown in FIG. 6B, the film portion 60 may be one member.

As in a sensor 113 of one embodiment as shown in FIG. 6C, the first magnetic portion 21 may not overlap the first element 51 in the Y-axis direction. For example, in the case where the distance L2 between the first magnetic portion 21 and the first element 51 is sufficiently long, a uniform bias magnetic field can be applied to the first element 51 even though the first magnetic portion 21 does not overlap the first element 51 in the Y-axis direction. The size of the sensor increases as the distance L2 between the first magnetic portion 21 and the first element 51 lengthens; therefore, it is favorable for the distance L2 to be short.

Second Embodiment

FIG. 7A to FIG. 7D are schematic views illustrating a sensor according to a second embodiment.

Figure 8A:
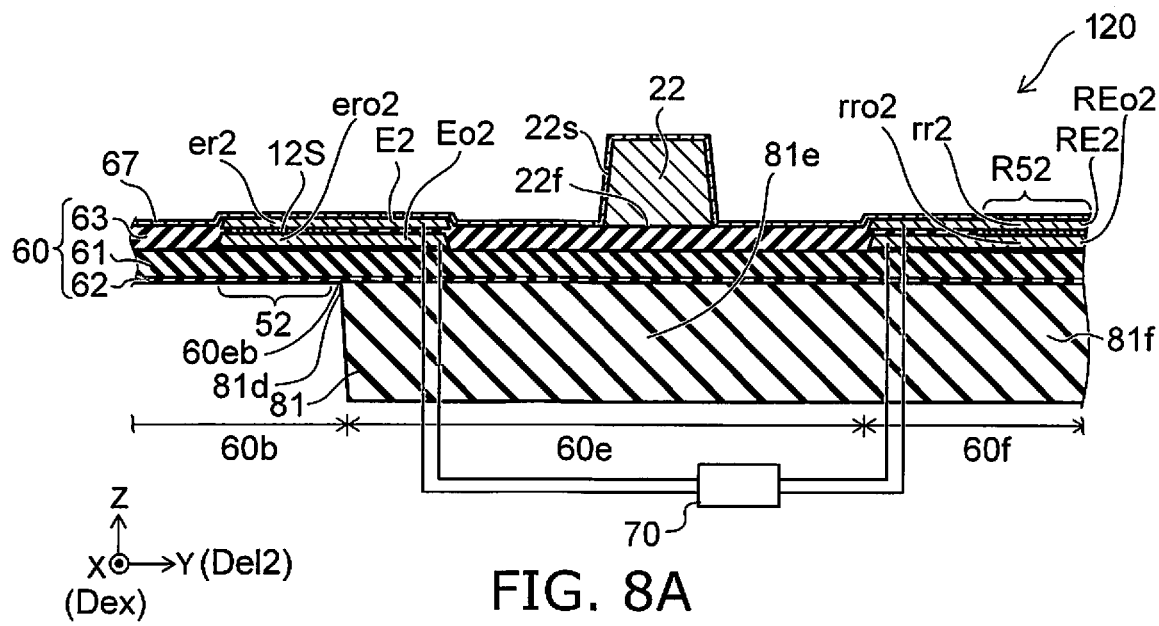
FIG. 8A and FIG. 8B are schematic views illustrating the sensor according to the second embodiment.
Figure 8B:
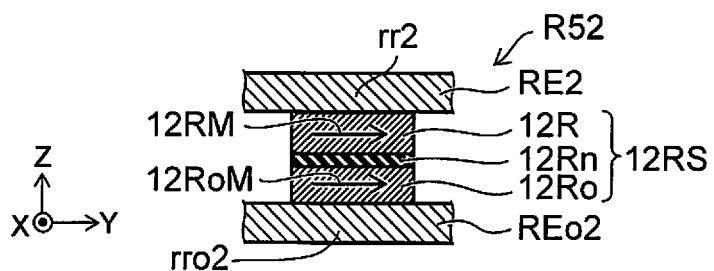

FIG. 8A and FIG. 8B are schematic views illustrating the sensor according to the second embodiment.

Figure 7A:
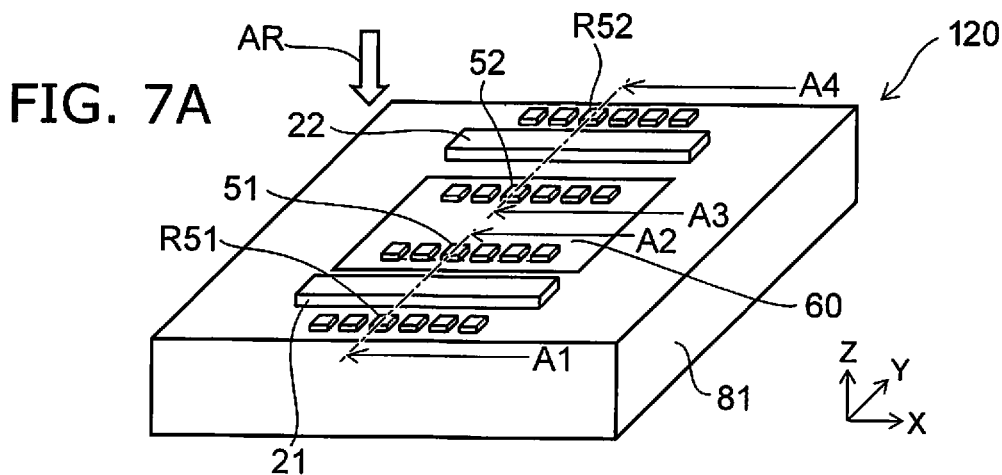
FIG. 7A to FIG. 7D are schematic views illustrating a sensor according to a second embodiment.
Figure 7B:
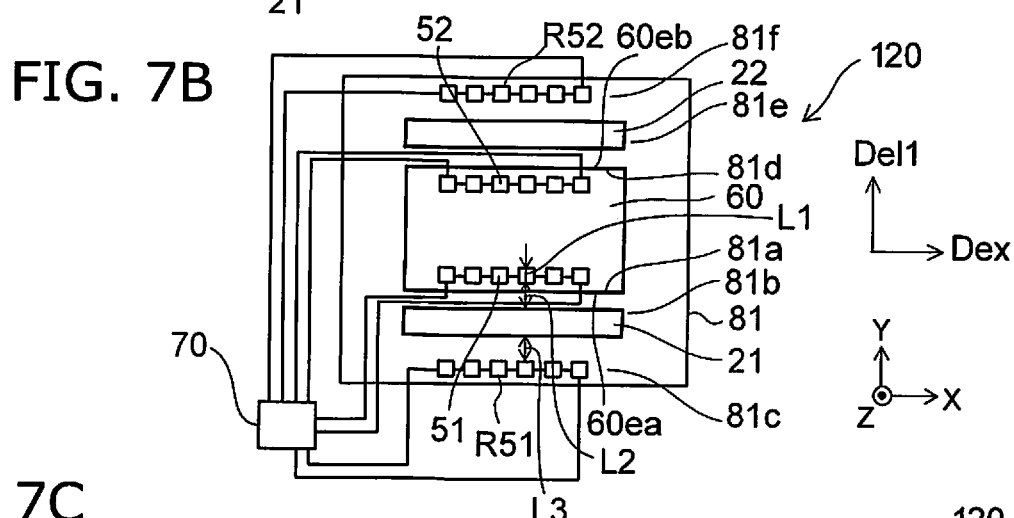
Figure 7C:
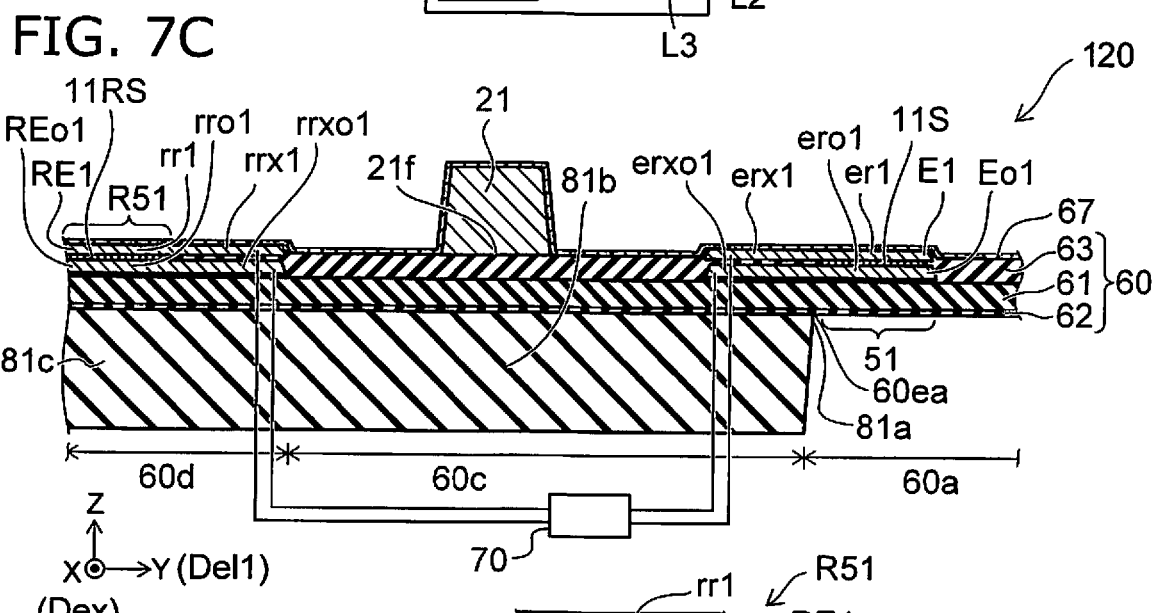
Figure 7D:
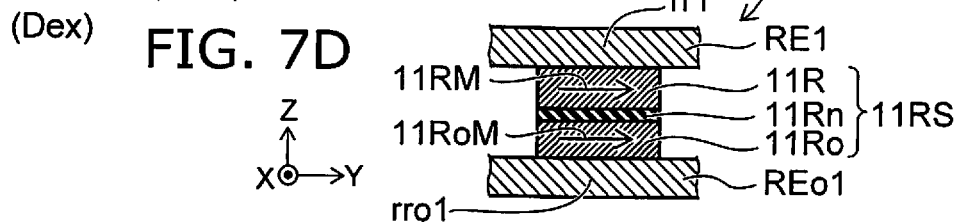

FIG. 7A is a perspective view. FIG. 7B is a plan view as viewed along arrow AR of FIG. 7A. FIG. 7C is a line A1-A2 cross-sectional view of FIG. 7A. FIG. 7D is a cross-sectional view of a portion of the sensor. FIG. 8A is a line A3-A4 cross-sectional view of FIG. 7A. FIG. 8B is a cross-sectional view of another portion of the sensor.

As shown in FIG. 7A and FIG. 7B, the sensor 120 according to the embodiment includes the supporter 81, the film portion 60, the first element 51, the first magnetic portion 21, and a first reference element R51. The second element 52, the second magnetic portion 22, and a second reference element R52 are further provided in the example. The configurations of the supporter 81, the film portion 60, the first element 51, the first magnetic portion 21, the second element 52, and the second magnetic portion 22 of the sensor 120 can be respectively similar to the configurations of the sensor 110. Hereinbelow, the portions of the sensor 120 that are different from those of the sensor 110 mainly will be described.

As shown in FIG. 7B and FIG. 7C, the supporter 81 includes the first support portion 81a, the second support portion 81b, and the third support portion 81c. For example, the second support portion 81b is between the first support portion 81a and the third support portion 81c.

In such a case as well, the film portion 60 includes the first partial region 60a supported by the first support portion 81a.

In such a case as well, the first element 51 is provided at the first partial region 60a. The first element 51 includes the first electrode region er1, the first opposing electrode region ero1, and the first magnetic layer 11 provided between the first electrode region er1 and the first opposing electrode region ero1 (referring to FIG. 1C and FIG. 1D).

In such a case as well, the direction from the first opposing electrode region ero1 toward the first electrode region er1 is taken as the first direction (the Z-axis direction).

The direction from the second support portion 81b toward the first magnetic portion 21 is aligned with the first direction (the Z-axis direction) recited above. The direction from the third support portion 81c toward the first reference element R51 is aligned with the first direction (the Z-axis direction).

As shown in FIG. 7C, for example, the film portion 60 further includes the third partial region 60c and the fourth partial region 60d in addition to the first partial region 60a. For example, the third partial region 60c is provided between the third support portion 81c and the first magnetic portion 21. For example, the fourth partial region 60d is provided between the fourth support portion 81d and the first reference element R51.

The direction from the first reference element R51 toward the first element 51 is taken as a first element direction Del1. The first element direction Del1 is, for example, the Y-axis direction. The position of the first magnetic portion 21 in the first element direction Del1 is between the position of the first reference element R51 in the first element direction Del1 and the position of the first element 51 in the first element direction Del1.

As shown in FIG. 7C, the first reference element R51 includes a first reference electrode region rr1, a first reference opposing electrode region rro1, and a first reference stacked portion 11RS. As shown in FIG. 7D, the first reference stacked portion 11RS includes a first reference magnetic layer 11R.

As shown in FIG. 7D, the first reference stacked portion 11RS includes a first reference magnetic layer 11R, a first reference opposing magnetic layer 11Ro, and a first reference intermediate layer 11Rn. The first reference intermediate layer 11Rn is provided between the first reference magnetic layer 11R and the first reference opposing magnetic layer 11Ro. The first reference intermediate layer 11Rn is nonmagnetic.

As shown in FIG. 7C, the first reference electrode region rr1 is a portion of a first reference electrode RE1. The first reference electrode RE1 may further include another reference electrode region rrx1 in addition to the first reference electrode region rr1. The first reference opposing electrode region rro1 is a portion of a first reference opposing electrode REo1. The first reference opposing electrode REo1 may further include another reference electrode region rrxo1 in addition to the first reference opposing electrode region rro1. For example, the reference electrode region rrx1 and the reference electrode region rrxo1 are connected to the circuit portion 70.

As shown in FIG. 7D, the first reference magnetic layer 11R has a magnetization 11RM. The first reference opposing magnetic layer 11Ro has a magnetization 11RoM. At least one of these magnetizations may change according to the external magnetic field applied to the first reference element R51. The external magnetic field may be, for example, geomagnetism, etc. The external magnetic field is, for example, noise. The external magnetic field is applied also to the first element 51 detecting the external force such as sound, etc. In the first element 51, a change of the electrical resistance is generated according to the strain ε generated according to the external force such as sound, etc., and the external magnetic field (the noise) recited above. On the other hand, the first reference element R51 is provided at the second support portion 81b which substantially does not deform. Therefore, in the first reference element R51, the change of the electrical resistance corresponding to the strain ε generated according to the external force such as sound or the like is substantially not generated. The external force such as sound, etc., can be detected with higher sensitivity by detecting, for example, the difference between the output of the first element 51 and the output of the first reference element R51.

In such a case as well, as shown in FIG. 7B, the distance L2 (the length along a direction (e.g., the Y-axis direction) crossing the first direction) between the first magnetic portion 21 and the first element 51 is longer than the length L1 (along the direction (e.g., the Y-axis direction recited above)) of the first element 51. For example, the distance L2 is not less than 1.1 times and not more than 50 times the length L1. The orientation of the magnetization of the first element 51 is easily controlled uniformly.

On the other hand, as shown in FIG. 7B, the distance between the first magnetic portion 21 and the first reference element R51 is taken as a distance L3. The distance L3 is a length along a direction (e.g., the Y-axis direction) crossing the first direction. The distance L3 may be substantially the same as the distance L2. The distance L3 may be, for example, not less than 0.5 times and not more than 2 times the distance L2. For example, the strength of the bias magnetic field applied to the first element 51 from the first magnetic portion 21 is substantially the same as the strength of the bias magnetic field applied to the first reference element R51 from the first magnetic portion 21. Similarly to the first element 51, the orientation of the magnetization of the first reference element R51 is easily controlled uniformly.

For example, as shown in FIG. 7C, interconnects (e.g., the reference electrode region rrx1, the reference electrode region rrxo1, etc.) may be provided between the first magnetic portion 21 and the first reference element R51. For example, the exterior form of the sensor 120 can be small.

As shown in FIG. 7B and FIG. 8A, the fourth support portion 81d, a fifth support portion 81e, and a sixth support portion 81f are further provided in the supporter 81. For example, the second support portion 81b is between the third support portion 81c and the sixth support portion 81f. The first support portion 81a is between the second support portion 81b and the sixth support portion 81f. The fourth support portion 81d is between the first support portion 81a and the sixth support portion 81f. The fifth support portion 81e is between the fourth support portion 81d and the sixth support portion 81f.

As shown in FIG. 8A, the film portion 60 further includes the second partial region 60b. The second partial region 60b is supported by the fourth support portion 81d. The second element 52 is provided at the second partial region 60b.

In such a case as well, the second element 52 includes the second electrode region er2, the second opposing electrode region ero2, and the second magnetic layer 12 (referring to FIG. 2B). The second magnetic layer 12 is provided between the second electrode region erg and the second opposing electrode region ero2 (referring to FIG. 2B).

As shown in FIG. 8A, the direction from the fifth support portion 81e toward the second magnetic portion 22 is aligned with the first direction (the Z-axis direction). The direction from the sixth support portion 81f toward the second reference element R52 is aligned with the first direction (the Z-axis direction).

In the example, the film portion 60 further includes a fifth partial region 60e and a sixth partial region 60f. For example, the fifth partial region 60e is provided between the fifth support portion 81e and the second magnetic portion 22. For example, the sixth partial region 60f is provided between the sixth support portion 81f and the second reference element R52.

As shown in FIG. 8A, the direction from the second element 52 toward the second reference element R52 is taken as a second element direction Del1. The second element direction Del2 is, for example, the Y-axis direction. The position of the second magnetic portion 22 in the second element direction Del2 is between the position of the second reference element R52 in the second element direction Del2 and the position of the second element 52 in the second element direction Del2.

The second reference element R52 includes a second reference electrode region rr2, a second reference opposing electrode region rro2, and a second reference magnetic layer 12R (referring to FIG. 8B). The second reference magnetic layer 12R is provided between the second reference electrode region rr2 and the second reference opposing electrode region rro2.

For example, a second reference stacked portion 12RS is provided between the second reference electrode region rr2 and the second reference opposing electrode region rro2.

As shown in FIG. 8B, the second reference stacked portion 12RS includes the second reference magnetic layer 12R, a second reference opposing magnetic layer 12Ro, and a second reference intermediate layer 12Rn. The second reference intermediate layer 12Rn is provided between the second reference magnetic layer 12R and the second reference opposing magnetic layer 12Ro. The second reference intermediate layer 12Rn is nonmagnetic.

As shown in FIG. 8B, the second reference electrode region rr2 is a portion of a second reference electrode RE2. The second reference electrode RE2 may further include another reference electrode region in addition to the second reference electrode region rr2. The second reference opposing electrode region rro2 is a portion of a second reference opposing electrode REo2. For example, the second reference electrode RE2 and the second reference opposing electrode REo2 are connected to the circuit portion 70.

As shown in FIG. 8B, the second reference magnetic layer 12R has a magnetization 12RM. The second reference opposing magnetic layer 12Ro has a magnetization 12RoM. At least one of these magnetizations may change according to the magnetic field applied to the first reference element R51. For example, the external force such as sound, etc., can be detected with higher sensitivity by detecting the difference between the output of the second element 52 and the output of the second reference element R52.

Figure 9:
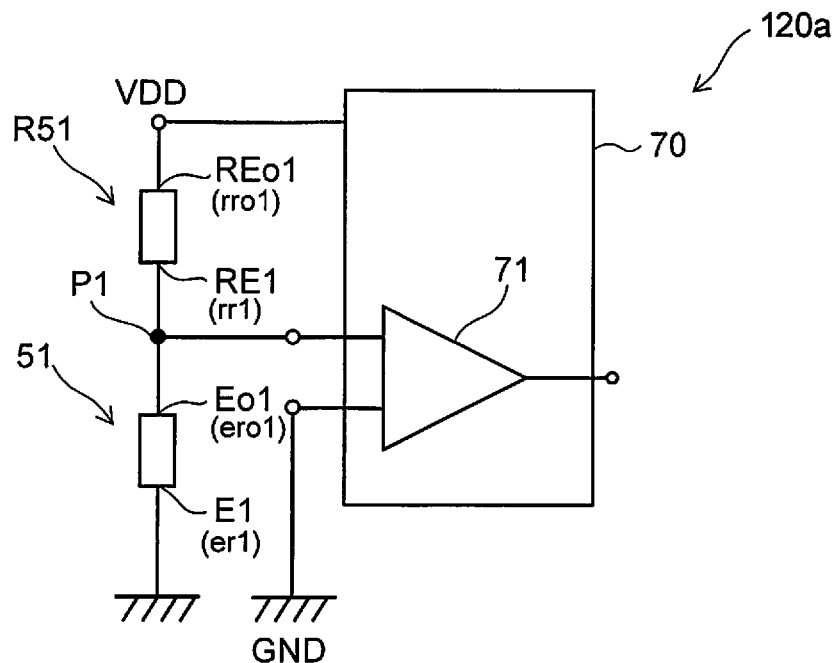
FIG. 9 is a schematic view illustrating a portion of a sensor according to the second embodiment.

FIG. 9 is a schematic view illustrating a portion of a sensor according to the second embodiment.

FIG. 9 shows one example of the circuit portion 70. In the sensor 120a, the detection is performed using the first element 51 and the first reference element R51.

As shown in FIG. 9, the circuit portion 70 is electrically connected to the first electrode region er1 (the first electrode E1), the first opposing electrode region ero1 (the first opposing electrode Eo1), the first reference electrode region rr1 (the first reference electrode RE1), and the first reference opposing electrode region rro1 (the first reference opposing electrode REo1).

The first opposing electrode region ero1 and the first reference electrode region rr1 are electrically connected in the example. The circuit portion 70 can output a signal corresponding to the change of the potential of a first connection point P1 between the first opposing electrode region ero1 and the first reference electrode region rr1.

For example, the first electrode region er1 is set to a ground potential GND. The first reference opposing electrode region rro1 is set to a voltage VDD. For example, the setting of these potentials (voltages) is performed by the circuit portion 70. The circuit portion 70 includes, for example, an amplifier 71. One input of the amplifier 71 is set to the ground potential GND. The other input of the amplifier 71 is electrically connected to the first connection point P1. Thereby, a signal corresponding to the change of the potential of the first connection point P1 is output from the amplifier 71. This signal corresponds to the component of the electrical resistance of the first element 51 based on the deformation of the film portion 60. A sensor can be provided in which the sensitivity can be increased.

In the sensor 120a, the circuit portion 70 outputs the signal by using a half-bridge configuration.

In the sensor 120a, the first electrode region er1 and the first opposing electrode region ero1 may be interchanged. The first reference electrode region rr1 and the first reference opposing electrode region rro1 may be interchanged.

For example, one of the first electrode region er1 or the first opposing electrode region ero1 and one of the first reference electrode region rr1 or the first reference opposing electrode region rro1 are electrically connected to each other. In such a case, the circuit portion can output a signal corresponding to the change of the potential of the first connection point between the one of the first electrode region er1 or the first opposing electrode region ero1 recited above and the one of the first reference electrode region rr1 or the first reference opposing electrode region rro1 recited above.

FIG. 10 is a schematic view illustrating a portion of a sensor according to the second embodiment.

FIG. 10 shows one example of the circuit portion 70. In the sensor 120b, the detection is performed using the first element 51, the first reference element R51, the second element 52, and the second reference element R52. In the sensor 120b, the circuit portion 70 outputs a signal by using a full-bridge configuration.

The circuit portion 70 is electrically connected to the first electrode region er1 (the first electrode E1), the first opposing electrode region ero1 (the first opposing electrode Eo1), the first reference electrode region rr1 (the first reference electrode RE1), the first reference opposing electrode region rro1 (the first reference opposing electrode REo1), the second electrode region er2 (the second electrode E2), the second opposing electrode region ero2 (the second opposing electrode Eo2), the second reference electrode region rr2 (the second reference electrode RE2), and the second reference opposing electrode region rro2 (the second reference opposing electrode REo2).

A first end of the first element 51 is one of the first electrode region er1 or the first opposing electrode region ero1. A second end of the first element 51 is the other of the first electrode region er1 or the first opposing electrode region ero1. A third end of the first reference element R51 is one of the first reference electrode region rr1 or the first reference opposing electrode region rro1. A fourth end of the first reference element R51 is the other of the first reference electrode region rr1 or the first reference opposing electrode region rro1. A fifth end of the second element 52 is one of the second electrode region er2 or the second opposing electrode region ero2. A sixth end of the second element 52 is the other of the second electrode region er2 or the second opposing electrode region ero2. A seventh end of the second reference element R52 is one of the second reference electrode region rr2 or the second reference opposing electrode region rro2. An eighth end of the second reference element R52 is the other of the second reference electrode region rr2 or the second reference opposing electrode region rro2.

The first end recited above is electrically connected to the fifth end recited above. The second end recited above is electrically connected to the third end recited above. The fourth end recited above is electrically connected to the eighth end recited above. The sixth end recited above is electrically connected to the seventh end recited above.

The circuit portion 70 can output a signal corresponding to the difference between the potential of the first connection point P1 between the second end recited above and the third end recited above and the potential of a second connection point P2 between the sixth end recited above and the seventh end recited above.

For example, the circuit portion 70 applies a voltage between a third connection point P3 between the first end recited above and the fifth end recited above and a fourth connection point P4 between the fourth end recited above and the eighth end recited above. For example, the third connection point P3 is set to the ground potential GND. For example, the voltage VDD is applied to the fourth connection point P4.

The circuit portion 70 includes, for example, the amplifier 71. One input of the amplifier 71 is electrically connected to the first connection point P1. The other one input of the amplifier 71 is electrically connected to the second connection point P2. A signal that corresponds to the difference between the potential of the first connection point P1 and the potential of the second connection point P2 is output from the amplifier 71. A sensor can be provided in which the sensitivity can be increased.

In the embodiment as shown in FIG. 7C, the first partial region 60a includes the first end portion 60ea supported by the first support portion 81a. As shown in FIG. 8A, the second partial region 60b includes the second end portion 60eb supported by the third support portion 81c.

As shown in FIG. 7B, the first end portion 60ea and the second end portion 60eb extend along the end portion extension direction Dex (the X-axis direction) crossing the first direction. The length along the end portion extension direction Dex of the first end portion 60ea and the length along the end portion extension direction Dex of the second end portion 60eb each are longer than the distance between the first end portion 60ea and the second end portion 60eb.

The distance between the first element 51 and the first end portion 60ea is shorter than the distance between the second element 52 and the first end portion 60ea. The distance between the second element 52 and the second end portion 60eb is shorter than the distance between the first element 51 and the second end portion 60eb.

Multiple first elements 51 may be provided as shown in FIG. 7B. The multiple first elements 51 are arranged along the end portion extension direction Dex. At least two of the multiple first elements 51 may be connected electrically in series. Multiple second elements 52 may be provided. The multiple second elements 52 are arranged along the end portion extension direction Dex. At least two of the multiple second elements 52 may be connected electrically in series.

The first partial region 60a is deformable. The electrical resistance of the first element 51 can change according to the deformation of the first partial region 60a. The second partial region 60b is deformable. The electrical resistance of the second element 52 can change according to the deformation of the second partial region 60b.

Examples of the first reference element R51 and the second reference element R52 will now be described.

Figure 11A:
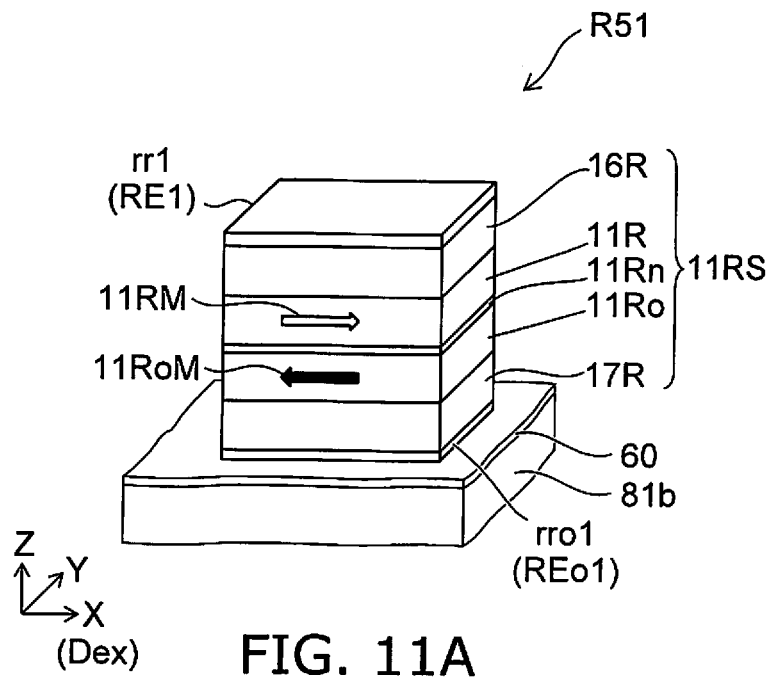
FIG. 11A and FIG. 11B are schematic views illustrating portions of the sensor according to the second embodiment.
Figure 11B:
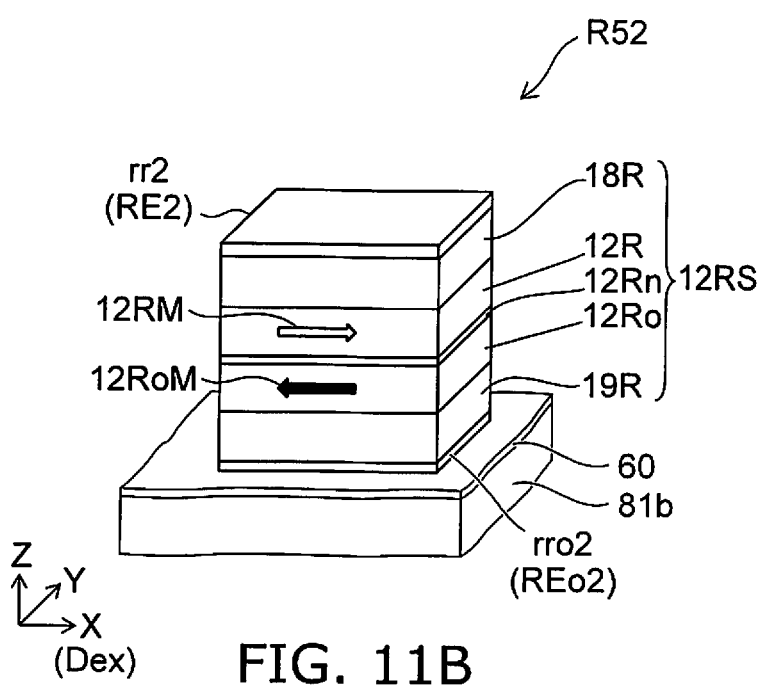

FIG. 11A and FIG. 11B are schematic views illustrating portions of the sensor according to the second embodiment.

FIG. 11A and FIG. 11B are perspective views illustrating the first reference element R51 and the second reference element R52.

In the first reference element R51 as shown in FIG. 11A, the first reference stacked portion 11RS further includes a first reference antiferromagnetic layer 16R and a first reference opposing antiferromagnetic layer 17R in addition to the first reference magnetic layer 11R, the first reference opposing magnetic layer 11Ro, and the first reference intermediate layer 11Rn.

The first reference magnetic layer 11R is provided between the first reference antiferromagnetic layer 16R and the first reference intermediate layer 11Rn. The first reference opposing magnetic layer 11Ro is provided between the first reference opposing antiferromagnetic layer 17R and the first reference intermediate layer 11Rn. An exchange coupling bias is generated in the first reference magnetic layer 11R by the effect of the first reference antiferromagnetic layer 16R. The magnetization of the first reference magnetic layer 11R is tilted with respect to, for example, the X-axis direction by the effect of the exchange coupling bias and the effect of the bias magnetic field 21H from the first magnetic portion 21. An exchange coupling bias is generated in the first reference opposing magnetic layer 11Ro by the effect of the first reference opposing antiferromagnetic layer 17R. For example, the magnetization of the first reference opposing magnetic layer 11Ro is aligned with the X-axis direction.

In the second reference element R52 as shown in FIG. 11B, the second reference stacked portion 12RS further includes a second reference antiferromagnetic layer 18R and a second reference opposing antiferromagnetic layer 19R in addition to the second reference magnetic layer 12R, the second reference opposing magnetic layer 12Ro, and the second reference intermediate layer 12Rn.

The second reference magnetic layer 12R is provided between the second reference antiferromagnetic layer 18R and the second reference intermediate layer 12Rn. The second reference opposing magnetic layer 12Ro is provided between the second reference opposing antiferromagnetic layer 19R and the second reference intermediate layer 12Rn. An exchange coupling bias is generated in the second reference magnetic layer 12R by the effect of the second reference antiferromagnetic layer 18R. The magnetization of the second reference magnetic layer 12R is tilted with respect to, for example, the X-axis direction by the effect of the exchange coupling bias and the effect of the bias magnetic field 22H from the second magnetic portion 22. An exchange coupling bias is generated in the second reference opposing magnetic layer 12Ro by the effect of the second reference opposing antiferromagnetic layer 19R. For example, the magnetization of the second reference opposing magnetic layer 12Ro is aligned with the X-axis direction.

FIG. 12A to FIG. 12D are schematic cross-sectional views illustrating portions of the sensor according to the second embodiment.

Figure 12A:
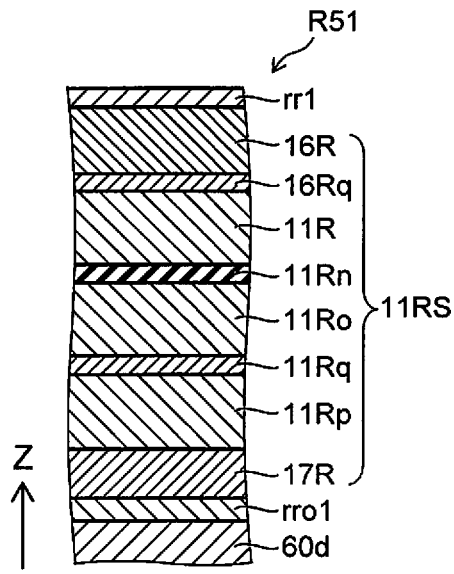
FIG. 12A to FIG. 12D are schematic cross-sectional views illustrating portions of the sensor according to the second embodiment.
Figure 12B:
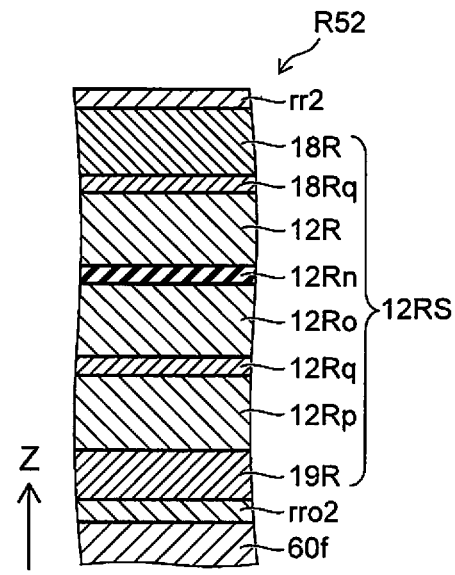
Figure 12C:
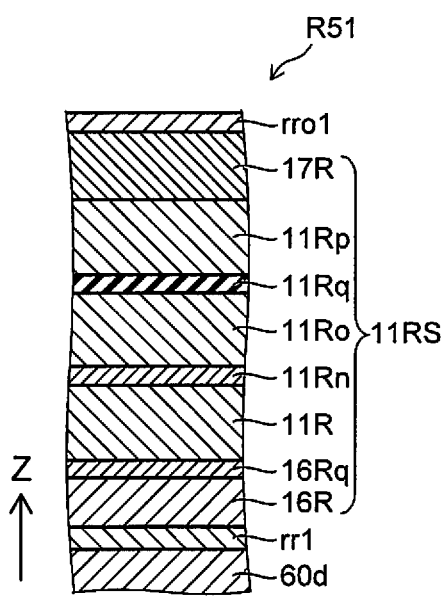
Figure 12D:
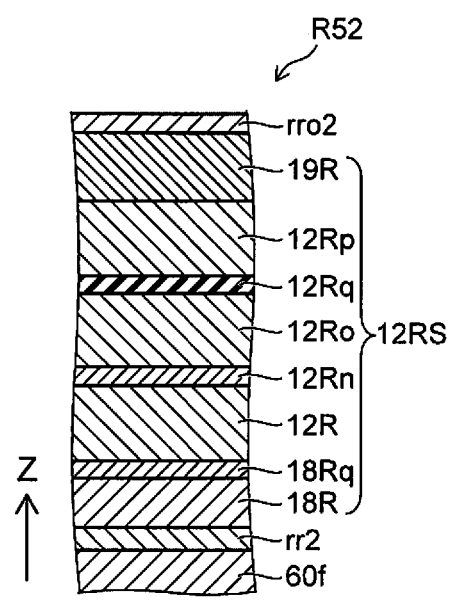

FIG. 12A and FIG. 12C illustrate the first reference element R51. FIG. 12B and FIG. 12D illustrate the second reference element R52.

In one example as shown in FIG. 12A, the first reference element R51 has the configuration of the first reference electrode region rr1/first reference antiferromagnetic layer 16R/nonmagnetic layer 16Rq/first reference magnetic layer 11R/first reference intermediate layer 11Rn/first reference opposing magnetic layer 11Ro/antiferromagnetic layer 11Rq/magnetic layer 11Rp/first reference opposing antiferromagnetic layer 17R/first reference opposing electrode region rro1. The first reference element R51 is provided at the fourth partial region 60d of the film portion 60.

For example, the first reference opposing magnetic layer 11Ro and a magnetic layer 11Rp have antiferromagnetic exchange coupling. An exchange coupling bias is generated in the first reference magnetic layer 11R by the first reference antiferromagnetic layer 16R. The nonmagnetic layer 16Rq may be omitted.

In one example as shown in FIG. 12B, the second reference element R52 has the configuration of the second reference electrode region rr2/second reference antiferromagnetic layer 18R/nonmagnetic layer 18Rq/second reference magnetic layer 12R/second reference intermediate layer 12Rn/second reference opposing magnetic layer 12Ro/antiferromagnetic layer 12Rq/magnetic layer 12Rp/second reference opposing antiferromagnetic layer 19R/second reference opposing electrode region rro2. The second reference element R52 is provided at the sixth partial region 60f of the film portion 60.

For example, the second reference opposing magnetic layer 12Ro and the magnetic layer 12Rp have antiferromagnetic exchange coupling. An exchange coupling bias is generated in the second reference magnetic layer 12R by the second reference antiferromagnetic layer 18R. The nonmagnetic layer 18Rq may be omitted.

In one example as shown in FIG. 12C, the first reference element R51 has the configuration of the first reference opposing electrode region rro1/first reference opposing antiferromagnetic layer 17R/magnetic layer 11Rp/antiferromagnetic layer 11Rq/first reference opposing magnetic layer 11Ro/first reference intermediate layer 11Rn/first reference magnetic layer 11R/nonmagnetic layer 16Rq/first reference antiferromagnetic layer 16R/first reference electrode region rr1. The first reference element R51 is provided at the fourth partial region 60d of the film portion 60.

In the example as well, for example, the first reference opposing magnetic layer 11Ro and the magnetic layer 11Rp have antiferromagnetic exchange coupling. An exchange coupling bias is generated in the first reference magnetic layer 11R by the first reference antiferromagnetic layer 16R. The nonmagnetic layer 16Rq may be omitted.

In one example as shown in FIG. 12D, the second reference element R52 has the configuration of the second reference opposing electrode region rro2/second reference opposing antiferromagnetic layer 19R/magnetic layer 12Rp/antiferromagnetic layer 12Rq/second reference opposing magnetic layer 12Ro/second reference intermediate layer 12Rn/second reference magnetic layer 12R/nonmagnetic layer 18Rq/second reference antiferromagnetic layer 18R/second reference electrode region rr2. The second reference element R52 is provided at the sixth partial region 60f of the film portion 60.

In the example as well, for example, the second reference opposing magnetic layer 12Ro and the magnetic layer 12Rp have antiferromagnetic exchange coupling. An exchange coupling bias is generated in the second reference magnetic layer 12R by the second reference antiferromagnetic layer 18R. The nonmagnetic layer 18Rq may be omitted.

Figure 13:
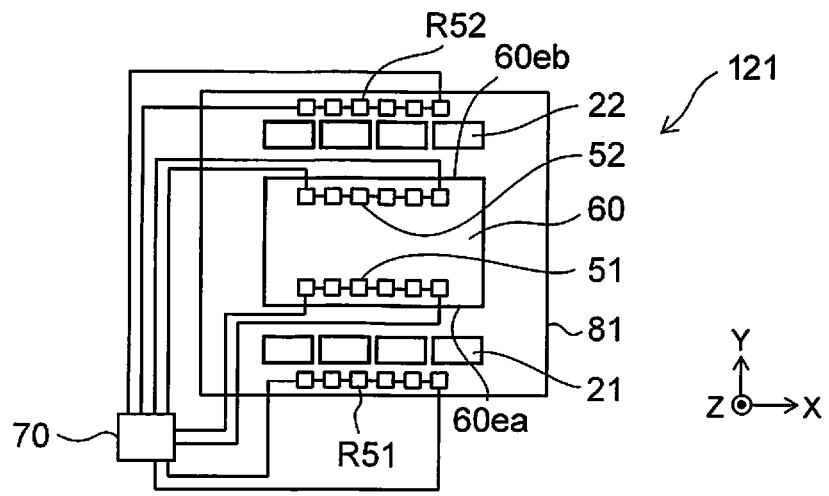
FIG. 13 is a schematic plan view illustrating a sensor according to the second embodiment.

FIG. 13 is a schematic plan view illustrating a sensor according to the second embodiment.

Multiple first magnetic portions 21 and multiple second magnetic portions 22 may be provided as shown in FIG. 13. One of the multiple first magnetic portions 21 may oppose at least two of the multiple first elements. One of the multiple second magnetic portions 22 may oppose at least two of the multiple second elements.

Third Embodiment

Figure 14:
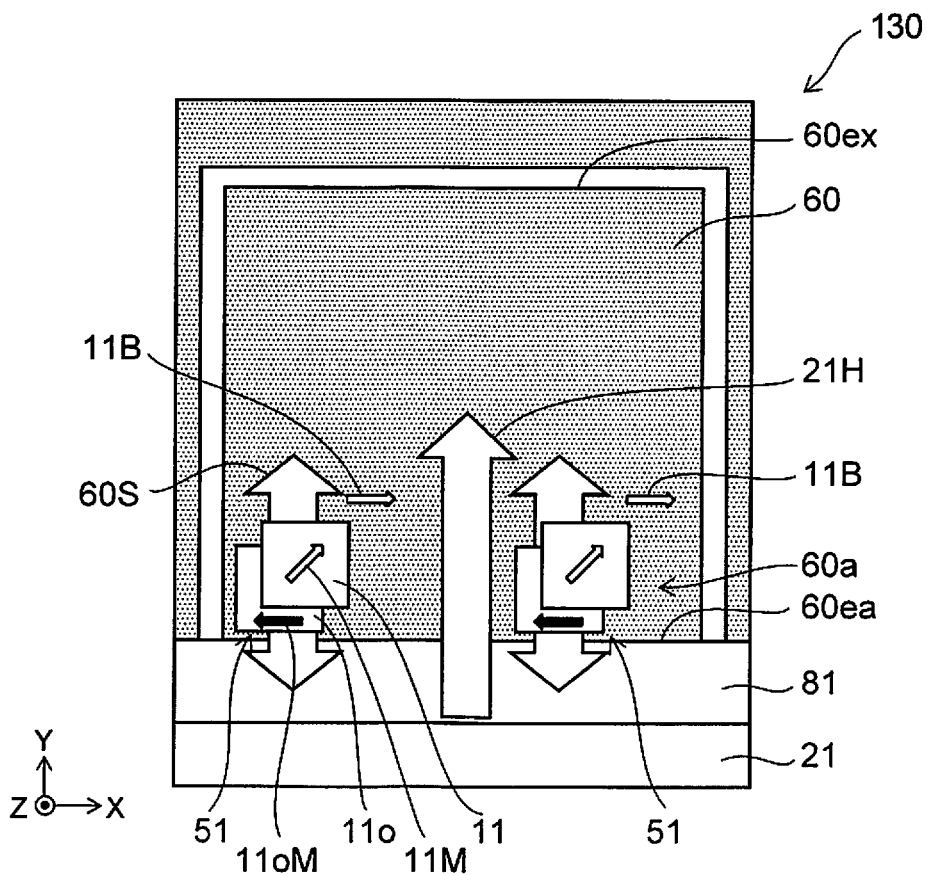
FIG. 14 is a schematic plan view illustrating a sensor according to a third embodiment.

FIG. 14 is a schematic plan view illustrating a sensor according to a third embodiment.

As shown in FIG. 14, the sensor 130 according to the embodiment also includes the supporter 81, the film portion 60, the first element 51, and the first magnetic portion 21. In the example, the film portion 60 is a "cantilever beam." Otherwise, the configuration of the sensor 130 may be the same as that of the sensor 110.

In the sensor 130, the film portion 60 includes the first partial region 60a. The first partial region 60a includes the first end portion 60ea. The first end portion 60ea is supported by the supporter 81 (the first support portion 81a: referring to FIG. 1C). The first partial region 60a includes another end 60ex. For example, the first end portion 60ea is provided between the other end 60ex and the first magnetic portion 21 in the Y-axis direction. For example, the first element 51 is provided between the other end 60ex and the first end portion 60ea in the Y-axis direction.

In the sensor 130 as well, a sensor can be provided in which the sensitivity can be increased. The first reference element R51 may be provided in the sensor 130. In the sensor 130, multiple first elements 51 are provided for one film portion 60.

Figure 15A:
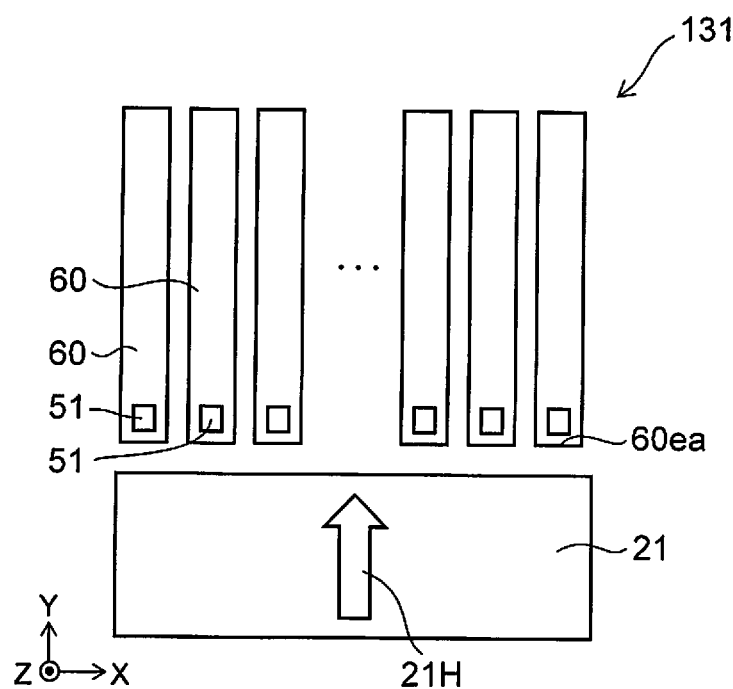
FIG. 15A and FIG. 15B are schematic plan views illustrating sensors according to the third embodiment.
Figure 15B:
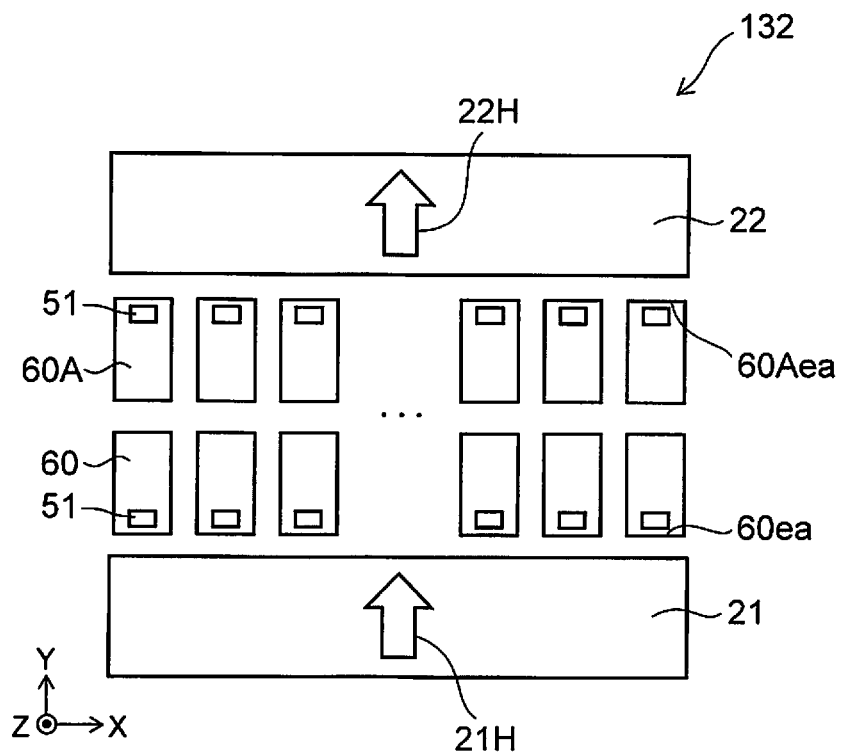

FIG. 15A and FIG. 15B are schematic plan views illustrating sensors according to the third embodiment.

Multiple film portions 60 are provided in a sensor 131 as shown in FIG. 15A. One or more first elements 51 may be provided for each one of the multiple film portions 60. Each of the multiple film portions 60 is supported by the supporter 81 by the first end portion 60ea (referring to FIG. 14).

The multiple film portions 60 and multiple film portions 60A are provided in a sensor 132 as shown in FIG. 15B. The multiple film portions 60 and the multiple film portions 60A are provided between the first magnetic portion 21 and the second magnetic portion 22. Each of the multiple film portions 60 is supported by the supporter 81 by the first end portion 60ea (referring to FIG. 14). Each of the multiple film portions 60A is supported by the supporter 81 by another first end portion 60eaA (referring to FIG. 14). One or more first elements 51 may be provided for each one of the multiple film portions 60. One or more first elements 51 may be provided for each one of the multiple film portions 60A.

In the embodiment recited above, at least one of the first magnetic layer 11 or the second magnetic layer 12 includes, for example, a ferromagnetic material. The ferromagnetic material includes at least one selected from the group consisting of iron (Fe), cobalt (Co), and nickel (Ni). The ferromagnetic material may include an alloy including at least one selected from the group recited above. At least one of the first magnetic layer 11 or the second magnetic layer 12 includes, for example, at least one selected from the group consisting of a cobalt-iron alloy (Co—Fe), an iron-cobalt alloy (Fe—Co), and a nickel-iron alloy (Ni—Fe). At least one of the first magnetic layer 11 or the second magnetic layer 12 may include at least one selected from the group consisting of boron (B), gallium (Ga), aluminum (Al), silicon (Si), and tungsten (W) in addition to the materials recited above. At least one of the first magnetic layer 11 or the second magnetic layer 12 includes, for example, at least one selected from the group consisting of a Co—Fe—B alloy, an Fe—B alloy, an Fe—Ga—B alloy, and an Fe—Co—Si—B alloy. For example, the Xs (the magnetostriction constant) is large for these materials.

At least one of the first opposing magnetic layer 11o or the second opposing magnetic layer 12o includes, for example, a ferromagnetic material. The ferromagnetic material includes at least one selected from the group consisting of iron (Fe), cobalt (Co), and nickel (Ni). The ferromagnetic material may include an alloy including at least one selected from the group recited above. At least one of the first opposing magnetic layer 11o or the second opposing magnetic layer 12o includes, for example, at least one selected from the group consisting of a cobalt-iron alloy (Co—Fe), an iron-cobalt alloy (Fe—Co), and a nickel-iron alloy (Ni—Fe). At least one of the first opposing magnetic layer 11o or the second opposing magnetic layer 12o may include at least one selected from the group consisting of boron (B), gallium (Ga), aluminum (Al), silicon (Si), and tungsten (W) in addition to the materials recited above. At least one of the first opposing magnetic layer 11o or the second opposing magnetic layer 12o includes, for example, at least one selected from the group consisting of a Co—Fe—B alloy, an Fe—B alloy, an Fe—Ga—B alloy, and an Fe—Co—Si—B alloy.

The first magnetic layer 11, the second magnetic layer 12, the first opposing magnetic layer 11o, and the second opposing magnetic layer 12o are, for example, ferromagnetic layers.

At least one of the first intermediate layer 11n or the second intermediate layer 12n includes, for example, a metal or an insulator. The metal includes, for example, at least one selected from the group consisting of copper (Cu), gold (Au), and silver (Ag). The metal includes, for example, at least one selected from the group consisting of titanium (Ti), vanadium (V), chrome (Cr), manganese (Mn), copper (Cu), molybdenum (Mo), ruthenium (Ru), palladium (Pd), silver (Ag), and gold (Au). The insulator includes, for example, at least one selected from the group consisting of magnesium oxide (MgO, etc.), aluminum oxide ($Al_2O_3$, etc.), titanium oxide (TiO, etc.), zinc oxide (ZnO, etc.), and gallium oxide (Ga—O).

For example, the first intermediate layer 11n breaks the magnetic coupling between the first magnetic layer 11 and the first opposing magnetic layer 11o. For example, the second intermediate layer 12n breaks the magnetic coupling between the second magnetic layer 12 and the second opposing magnetic layer 12o.

At least one of the first magnetic portion 21 or the second magnetic portion 22 includes, for example, a ferromagnetic material. The ferromagnetic material includes at least one selected from the group consisting of iron (Fe), cobalt (Co), and nickel (Ni). In at least one of the first magnetic portion 21 or the second magnetic portion 22, the ferromagnetic material may include, for example, an alloy including at least one selected from the group recited above. At least one of the first magnetic portion 21 or the second magnetic portion 22 includes, for example, at least one selected from the group consisting of a cobalt-platinum alloy (Co—Pt), an iron-platinum alloy (Fe—Pt), a cobalt-palladium alloy (Co—Pd), and an iron-palladium alloy (Fe—Pd). At least one of the first magnetic portion 21 or the second magnetic portion 22 may further include another element in addition to the materials recited above. At least one of the first magnetic portion 21 or the second magnetic portion 22 includes, for example, at least one selected from the group consisting of Co—Pt (the ratio of Co being not less than 50 at. % and not more than 85 at. %), $(Co_xPt_{100-x})_{100-y}Cr_y$ (x being not less than 50 at. % and not more than 85 at. %, and y being not less than 0 at. % and not more than 40 at. %), and Fe—Pt (the ratio of Pt being not less than 40 at. % and not more than 60 at. %). For example, the magnetic anisotropy and the coercivity are relatively high for these materials. These materials are, for example, hard magnetic materials.

At least one of the first magnetic portion 21 or the second magnetic portion 22 may include, for example, at least one selected from the group consisting of an alnico magnet, a ferrite magnet, a neodymium magnet, and a samarium-cobalt magnet. These materials are, for example, "bulk permanent magnet materials."

At least one of the first antiferromagnetic layer 16, the first opposing antiferromagnetic layer 17, the second antiferromagnetic layer 18, or the second opposing antiferromagnetic layer 19 includes, for example, at least one selected from the group consisting of an iridium-manganese alloy (Ir—Mn), a platinum-manganese alloy (Pt—Mn), a palladium-platinum-manganese alloy (Pd—Pt—Mn), and a ruthenium-rhodium-manganese alloy (Ru—Rh—Mn).

Configurations and materials similar to the magnetic layers and the nonmagnetic layers included in the first element 51 are applicable to the magnetic layers and the nonmagnetic layers that are included in the first reference element R51. Configurations and materials similar to the magnetic layers and the nonmagnetic layers included in the second element 52 are applicable to the magnetic layers and the nonmagnetic layers included in the second reference element R52.

The embodiment may include an electronic device. The electronic device includes, for example, the sensors according to the embodiments recited above and the sensors of modifications of the embodiments recited above. The electronic device includes, for example, an information terminal. The information terminal includes a recorder, etc. The electronic device includes a microphone, a blood pressure sensor, a touch panel, etc.

Figure 16:
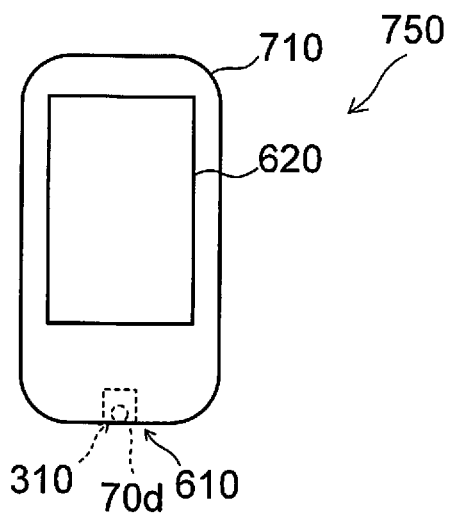
FIG. 16 is a schematic view illustrating an electronic device according to the embodiment.

FIG. 16 is a schematic view illustrating an electronic device according to the embodiment.

As shown in FIG. 16, the electronic device 750 according to the embodiment is, for example, an information terminal 710. For example, a microphone 610 is provided in the information terminal 710.

The microphone 610 includes, for example, a sensor 310. For example, the film portion 60 is substantially parallel to a surface where a displayer 620 of the information terminal 710 is provided. The arrangement of the film portion 60 is arbitrary. Any sensor described in reference to the embodiments recited above is applicable to the sensor 310.

Figures 17A, 17B:
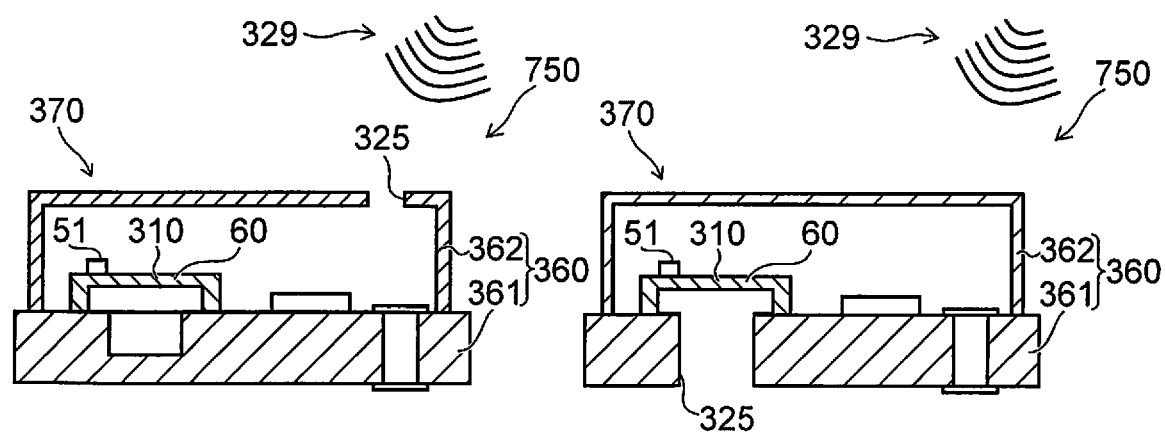
FIG. 17A and FIG. 17B are schematic cross-sectional views illustrating the electronic device according to the embodiment.

FIG. 17A and FIG. 17B are schematic cross-sectional views illustrating the electronic device according to the embodiment.

As shown in FIG. 17A and FIG. 17B, the electronic device 750 (e.g., a microphone 370 (an acoustic microphone)) includes a housing 360, a cover 362, and the sensor 310. The housing 360 includes, for example, a substrate 361 (e.g., a printed circuit board) and the cover 362. The substrate 361 includes, for example, a circuit such as an amplifier, etc.

An acoustic hole 325 is provided in the housing 360 (at least one of the substrate 361 or the cover 362). In the example shown in FIG. 33B, the acoustic hole 325 is provided in the cover 362. In the example shown in FIG. 33B, the acoustic hole 325 is provided in the substrate 361. Sound 329 passes through the acoustic hole 325 and enters the interior of the cover 362. The microphone 370 responds to the sound pressure.

For example, the sensor 310 is placed on the substrate 361; and an electrical signal line (not illustrated) is provided. The cover 362 is provided to cover the sensor 310. The housing 360 is provided around the sensor 310. At least a portion of the sensor 310 is provided inside the housing 360. For example, the first element 51 and the film portion 60 are provided between the substrate 361 and the cover 362. For example, the sensor 310 is provided between the substrate 361 and the cover 362.

The embodiments may include the following configurations (e.g., technological proposals).

Configuration 1

A sensor, comprising:
a supporter including a first support portion and a second support portion;
a film portion including a first partial region supported by the first support portion;
a first element provided at the first partial region, the first element including a first electrode region, a first opposing electrode region, and a first magnetic layer provided between the first electrode region and the first opposing electrode region; and a first magnetic portion, a direction from the second support portion toward the first magnetic portion being aligned with a first direction, the first direction being from the first opposing electrode region toward the first electrode region, at least a portion of the first magnetic portion overlapping at least a portion of the first element in a direction crossing the first direction.

Configuration 2

A sensor, comprising:

a supporter including a first support portion and a second support portion;

a film portion including a first partial region supported by the first support portion;

a first element provided at the first partial region, the first element including a first electrode region, a first opposing electrode region, and a first magnetic layer provided between the first electrode region and the first opposing electrode region; and a first magnetic portion, a direction from the second support portion toward the first magnetic portion being aligned with a first direction, the first direction being from the first opposing electrode region toward the first electrode region, the first opposing electrode region being provided between the first partial region and the first electrode region in the first direction, the first electrode region having a first electrode surface and a second electrode surface, the second electrode surface being between the first electrode surface and the first magnetic layer in the first direction, the first magnetic portion having a first magnetic portion surface on the supporter side of the first magnetic portion, a position in the first direction of the first magnetic portion surface being between a position in the first direction of the first electrode surface and a position in the first direction of the supporter.

Configuration 3

The sensor according to Configuration 1 or 2, further comprising:

a second element; and a second magnetic portion, the supporter including a third support portion and a fourth support portion, the first support portion being between the second support portion and the fourth support portion, the third support portion being between the first support portion and the fourth support portion, the film portion further including a second partial region supported by the third support portion, the second element being provided at the second partial region, the second element including a second electrode region, a second opposing electrode region, and a second magnetic layer provided between the second electrode region and the second opposing electrode region, a direction from the fourth support portion toward the second magnetic portion being aligned with the first direction.

Configuration 4

The sensor according to Configuration 3, wherein a distance between the first element and the first magnetic portion is shorter than a distance between the second element and the first magnetic portion, and a distance between the second element and the second magnetic portion is shorter than a distance between the first element and the second magnetic portion.

Configuration 5

The sensor according to Configuration 3 or 4, wherein the first partial region includes a first end portion supported by the first support portion, the second partial region includes a second end portion supported by the third support portion, the first end portion and the second end portion extend along an end portion extension direction crossing the first direction, a length along the end portion extension direction of the first end portion and a length along the end portion extension direction of the second end portion each are longer than a distance between the first end portion and the second end portion, a distance between the first element and the first end portion is shorter than a distance between the second element and the first end portion, and a distance between the second element and the second end portion is shorter than a distance between the first element and the second end portion.

Configuration 6

The sensor according to Configuration 5, wherein a plurality of the first elements is provided, and the plurality of first elements is arranged along the end portion extension direction.

Configuration 7

The sensor according to Configuration 5, wherein the first element further includes:

a first opposing magnetic layer provided between the first magnetic layer and the first opposing electrode region; and a first intermediate layer provided between the first magnetic layer and the first opposing magnetic layer, the first intermediate layer being nonmagnetic.

Configuration 8

The sensor according to any one of Configurations 5 to 7, wherein the first element further includes a first opposing antiferromagnetic layer provided between the first opposing magnetic layer and the first opposing electrode region.

Configuration 9

The sensor according to any one of Configurations 5 to 7, wherein the first element further includes a first antiferromagnetic layer provided between the first magnetic layer and the first electrode region, and a magnetization of the first magnetic layer is tilted with respect to the end portion extension direction.

Configuration 10

A sensor, comprising:

a supporter including a first support portion, a second support portion, and a third support portion;

a film portion including a first partial region supported by the first support portion;

a first element provided at the first partial region, the first element including a first electrode region, a first opposing electrode region, and a first magnetic layer provided between the first electrode region and the first opposing electrode region;

a first reference element; and a first magnetic portion, a direction from the second support portion toward the first magnetic portion being aligned with a first direction, the first direction being from the first opposing electrode region toward the first electrode region, a direction from the third support portion toward the first reference element being aligned with the first direction, a position of the first magnetic portion in a first element direction being between a position of the first reference element in the first element direction and a position of the first element in the first element direction, the first element direction being from the first reference element toward the first element, the first reference element including a first reference electrode region, a first reference opposing electrode region, and a first reference magnetic layer provided between the first reference electrode region and the first reference opposing electrode region.

Configuration 11

The sensor according to Configuration 10, further comprising a circuit portion electrically connected to the first electrode region, the first opposing electrode region, the first reference electrode region, and the first reference opposing electrode region, one of the first electrode region or the first opposing electrode region and one of the first reference electrode region or the first reference opposing electrode region being electrically connected to each other, the circuit portion being configured to output a signal corresponding to a change of a potential of a first connection point between the one of the first electrode region or the first opposing electrode region and the one of the first reference electrode region or the first reference opposing electrode region.

Configuration 12

The sensor according to Configuration 10, further comprising:

a second element;

a second reference element; and a second magnetic portion, the supporter including a fourth support portion, a fifth support portion, and a sixth support portion, the second support portion being between the third support portion and the sixth support portion, the first support portion being between the second support portion and the sixth support portion, the fourth support portion being between the first support portion and the sixth support portion, the fifth support portion being between the fourth support portion and the sixth support portion, the film portion further including a second partial region supported by the fourth support portion, the second element being provided at the second partial region, the second element including a second electrode region, a second opposing electrode region, and a second magnetic layer provided between the second electrode region and the second opposing electrode region, a direction from the fifth support portion toward the second magnetic portion being aligned with the first direction, a direction from the sixth support portion toward the second reference element being aligned with the first direction, a position of the second magnetic portion in a second element direction being between a position of the second reference element in the second element direction and a position of the second element in the second element direction, the second element direction being from the second element toward the second reference element, the second reference element including a second reference electrode region, a second reference opposing electrode region, and a second reference magnetic layer provided between the second reference electrode region and the second reference opposing electrode region.

Configuration 13

The sensor according to Configuration 12, further comprising a circuit portion electrically connected to the first electrode region, the first opposing electrode region, the first reference electrode region, the first reference opposing electrode region, the second electrode region, the second opposing electrode region, the second reference electrode region, and the second reference opposing electrode region, a first end of the first element being one of the first electrode region or the first opposing electrode region, a second end of the first element being the other of the first electrode region or the first opposing electrode region, a third end of the first reference element being one of the first reference electrode region or the first reference opposing electrode region, a fourth end of the first reference element being the other of the first reference electrode region or the first reference opposing electrode region, a fifth end of the second element being one of the second electrode region or the second opposing electrode region, a sixth end of the second element being the other of the second electrode region or the second opposing electrode region, a seventh end of the second reference element being one of the second reference electrode region or the second reference opposing electrode region, an eighth end of the second reference element being the other of the second reference electrode region or the second reference opposing electrode region, the first end being electrically connected to the fifth end, the second end being electrically connected to the third end, the fourth end being electrically connected to the eighth end, the sixth end being electrically connected to the seventh end, the circuit portion being configured to output a signal corresponding to a difference between a potential of a first connection point between the second end and the third end and a potential of a second connection point between the sixth end and the seventh end.

Configuration 14

The sensor according to Configuration 13, wherein the circuit portion applies a voltage between a third connection point and a fourth connection point, the third connection point being between the first end and the fifth end, the fourth connection point being between the fourth end and the eighth end.

Configuration 15

The sensor according to any one of Configurations 12 to 14, wherein the first partial region includes a first end portion supported by the first support portion, the second partial region includes a second end portion supported by the third support portion, the first end portion and the second end portion extend along an end portion extension direction crossing the first direction, a length along the end portion extension direction of the first end portion and a length along the end portion extension direction of the second end portion each are longer than a distance between the first end portion and the second end portion, a distance between the first element and the first end portion is shorter than a distance between the second element and the first end portion, a distance between the second element and the second end portion is shorter than a distance between the first element and the second end portion.

Configuration 16

The sensor according to Configuration 15, wherein a plurality of the first elements is provided, and the plurality of first elements is arranged along the end portion extension direction.

Configuration 17

The sensor according to Configuration 15, wherein the first element further includes:

a first opposing magnetic layer provided between the first magnetic layer and the first opposing electrode region; and a first intermediate layer provided between the first magnetic layer and the first opposing magnetic layer, the first intermediate layer being nonmagnetic.

Configuration 18

The sensor according to any one of Configurations 15 to 17, wherein the first element further includes a first opposing antiferromagnetic layer provided between the first opposing magnetic layer and the first opposing electrode region.

Configuration 19

The sensor according to Configuration 18, wherein the first element further includes a first antiferromagnetic layer provided between the first magnetic layer and the first electrode region, and a magnetization of the first magnetic layer is tilted with respect to the end portion extension direction.

Configuration 20

The sensor according to any one of Configurations 1 to 19, wherein the first partial region is deformable, and an electrical resistance of the first element can change according to a deformation of the first partial region.

According to the embodiments, a sensor can be provided in which the sensitivity can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as film portions, supporters, elements, magnetic layers, nonmagnetic layers, magnetic portions, processors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors practicable by an appropriate design modification by one skilled in the art based on the sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
a supporter including a first support portion and a second support portion;
a film portion including a first partial region supported by the first support portion;
a first element provided at the first partial region, the first element including a first electrode region, a first opposing electrode region, and a first magnetic layer provided between the first electrode region and the first opposing electrode region;
a first magnetic portion,
a second element; and
a second magnetic portion,
a direction from the second support portion toward the first magnetic portion being aligned with a first direction, the first direction being from the first opposing electrode region toward the first electrode region,
at least a portion of the first magnetic portion overlapping at least a portion of the first element in a direction crossing the first direction,
the supporter including a third support portion and a fourth support portion,
the first support portion being between the second support portion and the fourth support portion,
the third support portion being between the first support portion and the fourth support portion,
the film portion further including a second partial region supported by the third support portion,
the second element being provided at the second partial region,
the second element including a second electrode region, a second opposing electrode region, and a second magnetic layer provided between the second electrode region and the second opposing electrode region,
a direction from the fourth support portion toward the second magnetic portion being aligned with the first direction.

2. The sensor according to claim 1, wherein
a distance between the first element and the first magnetic portion is shorter than a distance between the second element and the first magnetic portion, and a distance between the second element and the second magnetic portion is shorter than a distance between the first element and the second magnetic portion.

3. The sensor according to claim 1, wherein
the first partial region includes a first end portion supported by the first support portion,
the second partial region includes a second end portion supported by the third support portion,
the first end portion and the second end portion extend along an end portion extension direction crossing the first direction,
a length along the end portion extension direction of the first end portion and a length along the end portion extension direction of the second end portion each are longer than a distance between the first end portion and the second end portion,
a distance between the first element and the first end portion is shorter than a distance between the second element and the first end portion, and
a distance between the second element and the second end portion is shorter than a distance between the first element and the second end portion.

4. The sensor according to claim 3, wherein
a plurality of the first elements is provided, and
the plurality of first elements is arranged along the end portion extension direction.

5. The sensor according to claim 3, wherein
the first element further includes:
 a first opposing magnetic layer provided between the first magnetic layer and the first opposing electrode region; and
 a first intermediate layer provided between the first magnetic layer and the first opposing magnetic layer, the first intermediate layer being nonmagnetic.

6. The sensor according to claim 3, wherein the first element further includes a first opposing antiferromagnetic layer provided between the first opposing magnetic layer and the first opposing electrode region.

7. The sensor according to claim 3, wherein
the first element further includes a first antiferromagnetic layer provided between the first magnetic layer and the first electrode region, and
a magnetization of the first magnetic layer is tilted with respect to the end portion extension direction.

8. The sensor according to claim 1, wherein
the first partial region is deformable, and
an electrical resistance of the first element changes according to a deformation of the first partial region.

9. A sensor, comprising:
a supporter including a first support portion and a second support portion;
a film portion including a first partial region supported by the first support portion;
a first element provided at the first partial region, the first element including a first electrode region, a first opposing electrode region, and a first magnetic layer provided between the first electrode region and the first opposing electrode region; and
a first magnetic portion,
a direction from the second support portion toward the first magnetic portion being aligned with a first direction, the first direction being from the first opposing electrode region toward the first electrode region,
the first opposing electrode region being provided between the first partial region and the first electrode region in the first direction,
the first electrode region having a first electrode surface and a second electrode surface, the second electrode surface being between the first electrode surface and the first magnetic layer in the first direction,
the first magnetic portion having a first magnetic portion surface on the supporter side of the first magnetic portion,
a position in the first direction of the first magnetic portion surface being between a position in the first direction of the first electrode surface and a position in the first direction of the supporter.

10. A sensor, comprising:
a supporter including a first support portion, a second support portion, and a third support portion;
a film portion including a first partial region supported by the first support portion;
a first element provided at the first partial region, the first element including a first electrode region, a first opposing electrode region, and a first magnetic layer provided between the first electrode region and the first opposing electrode region;
a first reference element; and
a first magnetic portion,
a direction from the second support portion toward the first magnetic portion being aligned with a first direction, the first direction being from the first opposing electrode region toward the first electrode region,
a direction from the third support portion toward the first reference element being aligned with the first direction,
a position of the first magnetic portion in a first element direction being between a position of the first reference element in the first element direction and a position of the first element in the first element direction, the first element direction being from the first reference element toward the first element,
the first reference element including a first reference electrode region, a first reference opposing electrode region, and a first reference magnetic layer provided between the first reference electrode region and the first reference opposing electrode region.

11. The sensor according to claim 10, further comprising a circuit portion electrically connected to the first electrode region, the first opposing electrode region, the first reference electrode region, and the first reference opposing electrode region,
 one of the first electrode region or the first opposing electrode region and one of the first reference electrode region or the first reference opposing electrode region being electrically connected to each other,
 the circuit portion being configured to output a signal corresponding to a change of a potential of a first connection point between the one of the first electrode region or the first opposing electrode region and the one of the first reference electrode region or the first reference opposing electrode region.

12. The sensor according to claim 10, further comprising:
a second element;
a second reference element; and
a second magnetic portion,
the supporter including a fourth support portion, a fifth support portion, and a sixth support portion,
the second support portion being between the third support portion and the sixth support portion,
the first support portion being between the second support portion and the sixth support portion,
the fourth support portion being between the first support portion and the sixth support portion, the fifth support portion being between the fourth support portion and the sixth support portion, the film portion further including a second partial region supported by the fourth support portion, the second element being provided at the second partial region, the second element including a second electrode region, a second opposing electrode region, and a second magnetic layer provided between the second electrode region and the second opposing electrode region, a direction from the fifth support portion toward the second magnetic portion being aligned with the first direction, a direction from the sixth support portion toward the second reference element being aligned with the first direction, a position of the second magnetic portion in a second element direction being between a position of the second reference element in the second element direction and a position of the second element in the second element direction, the second element direction being from the second element toward the second reference element, the second reference element including a second reference electrode region, a second reference opposing electrode region, and a second reference magnetic layer provided between the second reference electrode region and the second reference opposing electrode region.

13. The sensor according to claim 12, further comprising a circuit portion electrically connected to the first electrode region, the first opposing electrode region, the first reference electrode region, the first reference opposing electrode region, the second electrode region, the second opposing electrode region, the second reference electrode region, and the second reference opposing electrode region, a first end of the first element being one of the first electrode region or the first opposing electrode region, a second end of the first element being the other of the first electrode region or the first opposing electrode region, a third end of the first reference element being one of the first reference electrode region or the first reference opposing electrode region, a fourth end of the first reference element being the other of the first reference electrode region or the first reference opposing electrode region, a fifth end of the second element being one of the second electrode region or the second opposing electrode region, a sixth end of the second element being the other of the second electrode region or the second opposing electrode region, a seventh end of the second reference element being one of the second reference electrode region or the second reference opposing electrode region, an eighth end of the second reference element being the other of the second reference electrode region or the second reference opposing electrode region, the first end being electrically connected to the fifth end, the second end being electrically connected to the third end, the fourth end being electrically connected to the eighth end, the sixth end being electrically connected to the seventh end, the circuit portion being configured to output a signal corresponding to a difference between a potential of a first connection point between the second end and the third end and a potential of a second connection point between the sixth end and the seventh end.

14. The sensor according to claim 13, wherein the circuit portion applies a voltage between a third connection point and a fourth connection point, the third connection point being between the first end and the fifth end, the fourth connection point being between the fourth end and the eighth end.

15. The sensor according to claim 12, wherein
the first partial region includes a first end portion supported by the first support portion,
the second partial region includes a second end portion supported by the third support portion,
the first end portion and the second end portion extend along an end portion extension direction crossing the first direction,
a length along the end portion extension direction of the first end portion and a length along the end portion extension direction of the second end portion each are longer than a distance between the first end portion and the second end portion,
a distance between the first element and the first end portion is shorter than a distance between the second element and the first end portion,
a distance between the second element and the second end portion is shorter than a distance between the first element and the second end portion.

16. The sensor according to claim 15, wherein
a plurality of the first elements is provided, and
the plurality of first elements is arranged along the end portion extension direction.

17. The sensor according to claim 15, wherein
the first element further includes:
a first opposing magnetic layer provided between the first magnetic layer and the first opposing electrode region; and
a first intermediate layer provided between the first magnetic layer and the first opposing magnetic layer, the first intermediate layer being nonmagnetic.

18. The sensor according to claim 15, wherein the first element further includes a first opposing antiferromagnetic layer provided between the first opposing magnetic layer and the first opposing electrode region.

19. The sensor according to claim 18, wherein
the first element further includes a first antiferromagnetic layer provided between the first magnetic layer and the first electrode region, and
a magnetization of the first magnetic layer is tilted with respect to the end portion extension direction.

* * * * *

UNITED STATES PATENT AND TRADEMARK OFFICE
CERTIFICATE OF CORRECTION

| | |
|---|---|
| PATENT NO. | : 11,137,295 B2 |
| APPLICATION NO. | : 16/276656 |
| DATED | : October 5, 2021 |
| INVENTOR(S) | : Shotaro Baba et al. |

It is certified that error appears in the above-identified patent and that said Letters Patent is hereby corrected as shown below:

On the Title Page

Item (54) and in the Specification, Column 1, Lines 1-2, in the Title, "PORTION,AN ELECTRODE REGION" should read --PORTION, AN ELECTRODE REGION--.

Signed and Sealed this
Nineteenth Day of April, 2022

Katherine Kelly Vidal
*Director of the United States Patent and Trademark Office*